(12) United States Patent
Shen

(10) Patent No.: US 11,177,193 B2
(45) Date of Patent: Nov. 16, 2021

(54) RESERVOIR STRUCTURE AND SYSTEM FORMING GAP FOR LIQUID THERMAL INTERFACE MATERIAL

(71) Applicant: Yuci Shen, San Jose, CA (US)

(72) Inventor: Yuci Shen, San Jose, CA (US)

( * ) Notice: Subject to any disclaimer, the term of this patent is extended or adjusted under 35 U.S.C. 154(b) by 37 days.

(21) Appl. No.: 16/837,777

(22) Filed: Apr. 1, 2020

(65) Prior Publication Data

US 2020/0350231 A1 Nov. 5, 2020

Related U.S. Application Data

(63) Continuation-in-part of application No. 16/400,666, filed on May 1, 2019, now Pat. No. 10,643,924.

(51) Int. Cl.
*H01L 23/34* (2006.01)
*H01L 23/473* (2006.01)
*H01L 23/433* (2006.01)
*H01L 23/373* (2006.01)

(52) U.S. Cl.
CPC ........ *H01L 23/473* (2013.01); *H01L 23/3736* (2013.01); *H01L 23/4334* (2013.01)

(58) Field of Classification Search
CPC ... H01L 23/473; H01L 23/4334; H01L 23/42; H01L 23/3736; H01L 2924/161
USPC ................... 257/712–714, 702, 704
See application file for complete search history.

(56) References Cited

U.S. PATENT DOCUMENTS

| | | | | |
|---|---|---|---|---|
| 5,780,928 A * | 7/1998 | Rostoker | ............... | H01L 23/427 257/713 |
| 6,953,227 B2 * | 10/2005 | Dunn | .................. | H01L 23/4332 165/80.4 |
| 7,002,247 B2 * | 2/2006 | Mok | ...................... | H01L 23/427 257/625 |
| 7,119,433 B2 * | 10/2006 | Corbin, Jr. | ............ | H01L 23/367 257/706 |
| 8,472,195 B2 * | 6/2013 | Nakanishi | ............. | H01L 23/552 361/717 |
| 8,723,205 B2 * | 5/2014 | Ramer | .................... | H01L 33/50 257/98 |
| 10,170,392 B2 * | 1/2019 | Chainer | ................ | H01L 23/473 |
| 2005/0280140 A1 * | 12/2005 | Corbin, Jr. | ............ | H01L 23/433 257/706 |
| 2007/0236810 A1 * | 10/2007 | Masui | .................... | G02B 13/22 359/740 |
| 2013/0264701 A1 * | 10/2013 | Loong | ................. | H01L 21/4878 257/712 |

* cited by examiner

*Primary Examiner* — Nitin Parekh

(57) ABSTRACT

The disclosure describes a heat-dissipating object having a reservoir structure so that a reservoir system can be formed in an electronic device, allowing for a liquid TIM in the gap between the heat-dissipating object and the electronic device. The reservoir structure comprises a seal ring, a connecting hole and a reservoir which is a tube for taking in a liquid material and releasing it again when needed. A heat-dissipating object, including a heat sink, a cold plate and a vapor chamber and an electronic device, including a flip chip package and a lidded flip chip package are particularly described in details of the embodiments of the present invention.

8 Claims, 34 Drawing Sheets

US 11,177,193 B2

RESERVOIR STRUCTURE AND SYSTEM FORMING GAP FOR LIQUID THERMAL INTERFACE MATERIAL

The present application is a continuation-in-part of U.S. patent application Ser. No. 16/785,577, filed Feb. 18, 2020, which is a divisional application of U.S. patent application Ser. No. 16/400,666, filed May 1, 2019.

TECHNICAL FIELD OF THE DISCLOSURE

The disclosure relates generally to a heat-dissipating object for dissipating heat from an electronic device, and particularly to a lid for a lidded flip chip package to use a liquid thermal interface material (TIM).

BACKGROUND OF THE DISCLOSURE

In a flip chip package with a semiconductor chip being a heat-generating object, a thermal interface material (TIM) is usually used to fill the gap between the flip chip and a heat-dissipating object, like a lid or a heat sink for transferring the heat from one to the other. The types of the TIM basically include thermal pad, thermal grease, phase change material and liquid metal. A good TIM needs to have 1) a high thermal conductivity, 2) a good surface wetting capability for reducing the thermal contact resistance, 3) a good gap filling capability, and 4) a good thermal reliability in test or application. A liquid metal as TIM usually includes gallium and gallium alloy. The melting point of the gallium is about 29° C., and that of gallium alloy is even lower. The thermal conductivity of the liquid metal is much higher than the extensively used thermal pad or thermal grease. Furthermore, a liquid metal has much better capability for surface wetting and gap filling. So, of all the types of TIM, a liquid metal is an ideal TIM if only looking at the first three items. If a liquid metal can be used in a lidded flip chip package, the temperature of the lidded flip chip package can be reduced significantly as compared to other types of TIM. However, the conventional lidded flip chip packages based on a conventional lid of prior arts are limited to use a liquid metal as its TIM due to the pumping-out issue, that is, when the package is under a thermal cycling test or in its long term of application, the volume of the gap between the flip chip and the lid varies with temperature due to the warpage of the flip chip, causing the liquid metal TIM to be pumped out. The TIM pumping-out issue will cause an incomplete gap filling between the flip chip and the lid, reducing the thermal performance of TIM. And the more important thing is that because a liquid metal is electrically conductive, a small amount of TIM pumping-out may damage the whole electronic device. As a result, a liquid metal type of TIM has not been commercially used in a lidded flip chip package. In general, because of the similar reason, a liquid metal type of TIM is rarely interposed between a heat-dissipating object (a heat sink, for example) and a heat-generating object (a semiconductor chip, for example) in an electronic device.

SUMMARY OF THE DISCLOSURE

For overcoming the TIM pumping-out issue for an electronic device such as a lidded flip chip package to use a liquid TIM, a heat-dissipating object coupled with a reservoir structure is described in the present disclosure, which is summarized below.

A heat-dissipating object allowing for a liquid TIM in an electronic device, comprising: a base plate having a top and a bottom surface, and a reservoir structure, comprising a reservoir, a seal ring and a connecting hole, wherein the reservoir is a space for taking in a liquid material and releasing it again when needed, the seal ring is an elastic-type ring mounted on the bottom surface of the base plate, and the connecting hole starts from the seal ring region of bottom surface of the base plate and connects to the reservoir. In particular, the heat-dissipating object is a lid for a lidded flip chip package to use a liquid TIM.

A lidded flip chip package with a liquid TIM, comprising: a flip chip package consisting of an edged flip chip attached on a substrate, a lid having a reservoir structure, and a reservoir system based on the reservoir structure of the lid; wherein the lid is attached on/in/to the substrate, therein covering the flip chip, the reservoir structure of the lid comprises a reservoir, a seal ring and a connecting hole, the reservoir is a space for taking in a liquid material and releasing it again when needed, the seal ring is an elastic-type ring mounted on the bottom surface of the lid, and the connecting hole starts from the seal ring region of bottom surface of the lid and connects to the reservoir; and wherein the reservoir system comprises the reservoir of the lid, the connecting hole of the lid, a sealed gap, and a liquid material; the seal ring of the reservoir structure of the lid seals the gap between the lid and the flip chip at the edge region of the flip chip, forming the sealed gap, the connecting hole is between the sealed gap and the reservoir for connecting the sealed gap with the reservoir, and the liquid material is filled in the sealed gap and the reservoir.

The features and advantages of the embodiments of the present disclosure will become more apparent from the detailed descriptions in conjunction with the drawings below. The drawings and associated descriptions are to illustrate the embodiments of the present disclosure, not to limit the scope of what is claimed.

DETAILED DESCRIPTION OF THE PREFERRED EMBODIMENT

Figure 1:
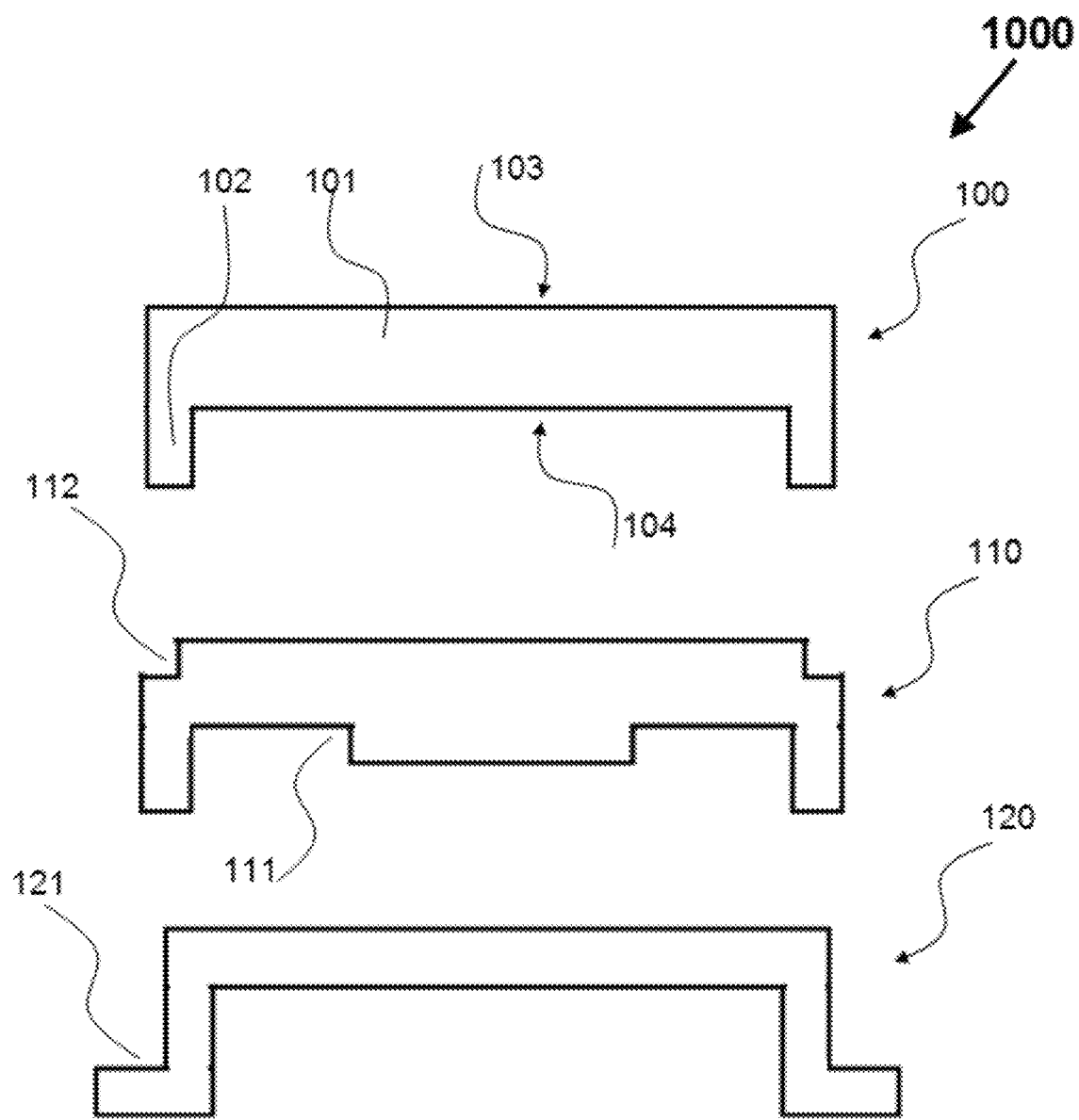
FIG. 1 is a schematic diagram for illustrating a conventional lid used in a lidded flip chip package of prior arts.
Figure 2:
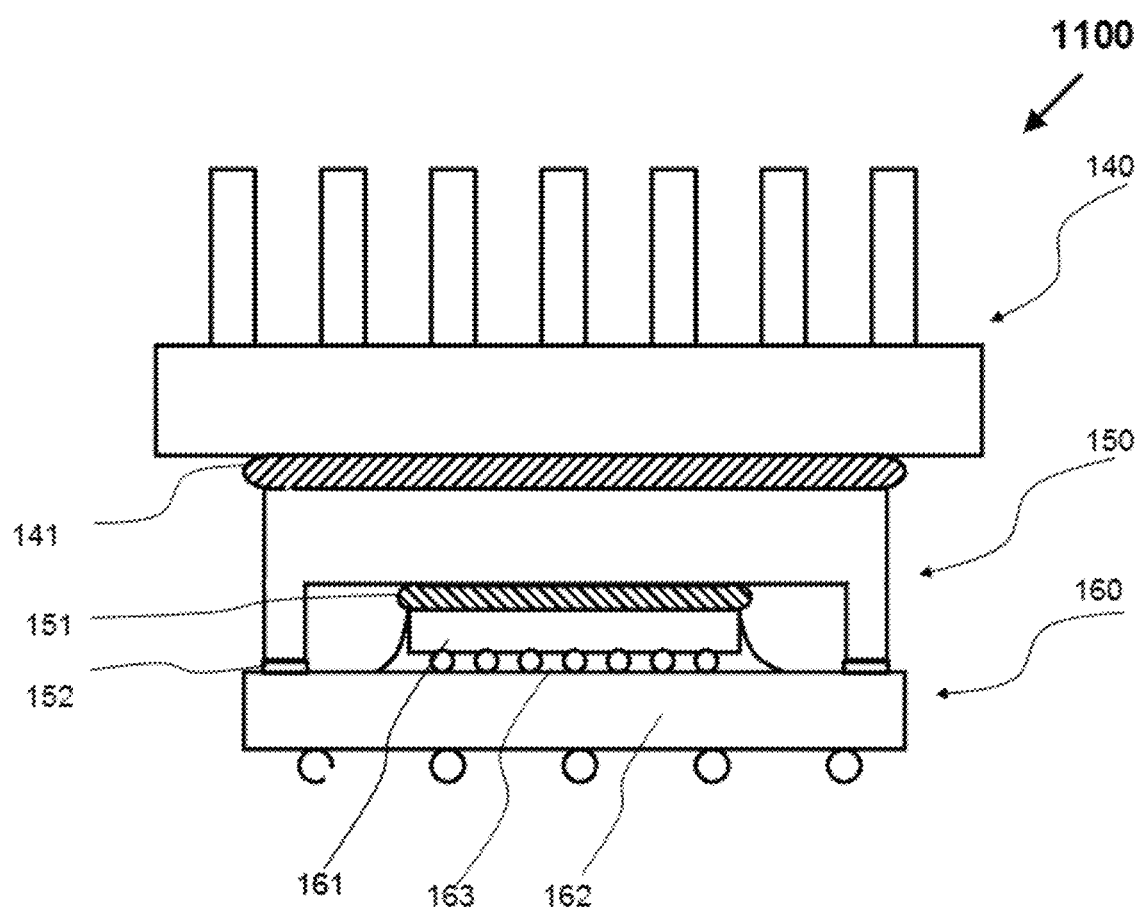
FIG. 2 is a schematic diagram for illustrating a lidded flip chip package of prior arts.

FIG. 1 and FIG. 2 are used to explain some terms associated with a lid, a lidded flip chip package and a thermal interface material (TIM), and to describe the challenges about using a liquid TIM in a lidded flip chip package of prior arts.

FIG. 1 is a schematic diagram for illustrating a conventional lid used for a lidded flip chip package. The numerical symbol 1000 in FIG. 1 designates some examples of conventional lids, in which the numerical symbol 100 designates a conventional lid, consisting of a top piece 101 and a side wall 102, 110 designates a conventional lid, further including the step of structures 111 and 112 for a specific application, and 120 designates a conventional hat type of lid, in which the side wall further includes the foot 121. The terms of the top and bottom surfaces of a lid is explained by the numerical symbol 103 and 104 in the lid 100. Most of the conventional lids for a lidded flip chip package are made from copper by using a stamping or machining manufacture process. A hat type of lid is usually for a thin lid, and a stamping manufacture process is used for it. All these conventional lids don't have any essential difference, and basically comprise a top piece and a side wall.

FIG. 2 is a schematic diagram for illustrating a conventional lidded flip chip package and its heat-dissipating way through a heat sink. The numerical symbol 1100 in FIG. 2 designates a conventional lidded flip chip package attached with a heat sink, in which the numerical symbol 140, 150 and 160 respectively designate a heat sink, a lid and a flip chip package. The flip chip package 160 consists of a flip chip 161 and a substrate 162, in which the flip chip 161 is attached on the middle region of top surface of the substrate 162 through a layer of bumps and underfill material 163. It is noted that for simplicity and clarity, the numerical symbol 160 is kept the same to designate a flip chip package in the drawings through the description of the present disclosure. The conventional lidded flip chip package is formed by attaching the lid 150 to the flip chip package 160, in which the lid 150 is attached on the peripheral region of top surface of the substrate 162 through a layer of adhesive material 152, covering the flip chip 161, and a TIM 151 is applied to fill the gap between the flip chip 161 and the lid 150. The heat sink 140 is attached on the top surface of the lid 150 for dissipating the heat generated by the flip chip 161 to the ambient. A TIM 141 is applied to fill the gap between the lid 150 and the heat sink 140. The TIM 151 and 141 are usually called TIM1 and TIM2. For TIM1 151, a liquid TIM is not commercially used because of its pumping-out issue under thermal cycling condition. For TIM2, a grease type of TIM or a thermal pad type of TIM is usually used, but a liquid type of TIM is rarely used because of the same reason. It is noted that the flip chip 161 is not always flat, but warps with temperature due to its CTE (coefficient of thermal expansion) mismatch with the substrate 162, causing the volume change of the gap between the flip chip 161 and the lid 150. As a result, a liquid TIM is easy to be pumped out, causing a challenge for a conventional lidded flip chip package to use a liquid TIM.

Figure 3:
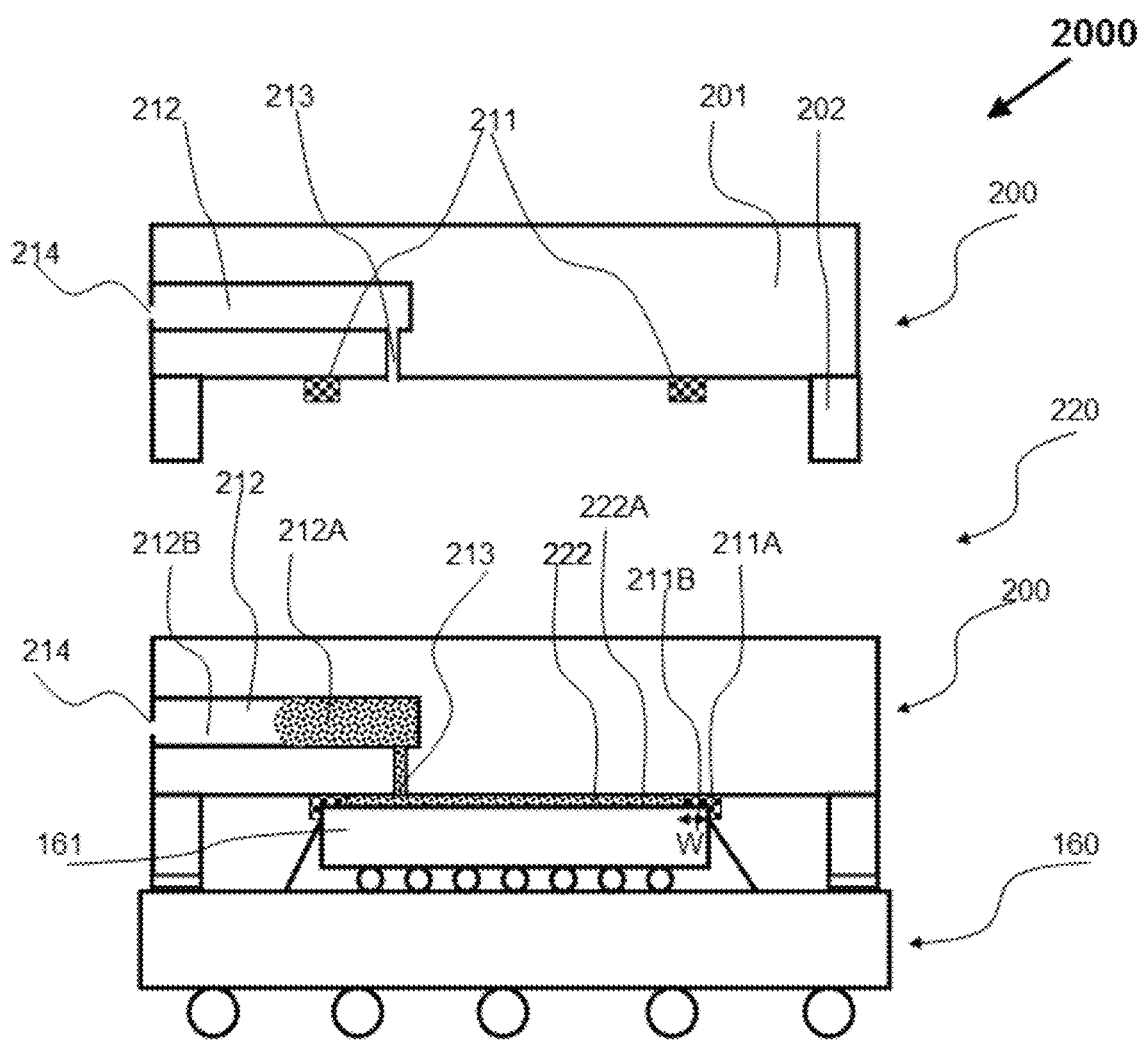
FIG. 3 is a schematic diagram for illustrating the basic ideal and features of a lid for a lidded flip chip package to use a liquid TIM of the present invention.

FIG. 3 is a schematic diagram for illustrating the basic ideal and features of a lid for a lidded flip chip package to use a liquid TIM of the present invention. The numerical symbol 2000 in FIG. 3 designates a lid 200 and a lidded flip chip package 220 based on the lid, wherein the lid includes a reservoir structure, and the lidded flip chip package 220 includes a reservoir system based on the reservoir structure, deviating them from the conventional ones. In additional to the top piece 201 and side wall 202, the present lid 200 includes a reservoir structure, consisting of a seal ring 211 mounted on its bottom surface, a reservoir 212 outside the seal ring region of bottom surface of the lid, and a connecting hole 213, starting from the seal ring region of bottom surface of the lid and connecting to the reservoir. Some terms and concepts are explained with reference to FIG. 3 for clarity. The end of the connecting hole at the bottom surface of the lid is called an inner end and the other end of the connecting hole is called an outer end. The seal ring region of bottom surface of the lid means the portion of the bottom surface of the lid surrounded by the seal ring. The reservoir 212 in the present disclosure means a space for taking in a liquid material and releasing it again when needed, which may be a cavity inside the lid as that in the example or a container outside the lid. The 214 designates an outlet of the reservoir 212, which opens to the ambient, and its inlet connects with the outer end of the connecting hole 213.

Referring to FIG. 3, after attaching the lid 200 onto the flip chip package 160, the lidded flip chip package 220 of the present disclosure is formed, wherein the lidded flip chip package 220 includes a reservoir system based on the reservoir structure of the lid 200, which consists of the reservoir 212 of the lid, the connecting hole 213 of the lid, a sealed gap 222, and a liquid material 222A/212A, the gap between the lid 220 and the flip chip 161 is sealed at the edge region of the flip chip 161 by the seal ring 211A, forming the sealed gap 222, the reservoir 212 is a cavity in the top piece of the lid in the example, which is generally a space outside the sealed gap 222, the connecting hole 213 is between the sealed gap 222 and the reservoir 212 for connecting one with the other, and a liquid material is fully filled in the sealed gap 222, and partially filled in the reservoir. The 222A and 212A respectively designate the liquid material in the gap 222 and reservoir 212, and the 212B designates the empty space in the reservoir 212. The liquid material 222A forms a liquid TIM between the flip chip 161 and lid 220. It is seen that when the volume of the sealed gap 222 gets smaller, the reservoir 212 can take in the excessive amount of liquid material from the sealed gap 222 to its empty space 212B, keeping the pressure inside the sealed gap 222 not to be high, and when the volume of the sealed gap 222 gets larger, the reservoir 212 can release the needed amount of liquid material into the sealed gap 222 from its stored liquid material 212A, keeping the sealed gap 222 to be fully filled.

It is noted that the reservoir 212 needs to have an outlet designated by 214 as showed in FIG. 3 to be opened to the ambient so that the liquid material can be taken in and released from and to the sealed gap 222 when needed. And it is also noted that if a lidded flip chip package only uses a sealed gap through a seal ring for adopting a liquid TIM, the sealed gap will not be fully filled when the volume of the sealed gap gets larger, and the pressure in the sealed gap will become high when the volume of the sealed gap gets smaller, breaking the seal ring. And it is further noted that the seal ring 211 is an elastic-type ring and a rubber-like material is preferred for making it so that the seal ring 211 can be tightly compressed onto the edge region of the flip chip 161 when assembling the lid 200 with the flip chip package 160, as showed by the seal ring 211A in the present lidded flip chip package 220, in which the seal ring 211A is at compression state as compared to its original state as showed by 211 in the lid 200. And it is further noted that the edge region of the flip chip 161 is covered by the seal ring 211A. Because the thermal conductivity of a rubber-like material which is preferred for the seal ring 211A is low, the width as designated by the numerical symbol 212B of the edge region of the flip chip 161 needs to be optimized according to both reliability and thermal consideration. A width value from 0.2 mm to 1 mm is preferred.

Figure 4:
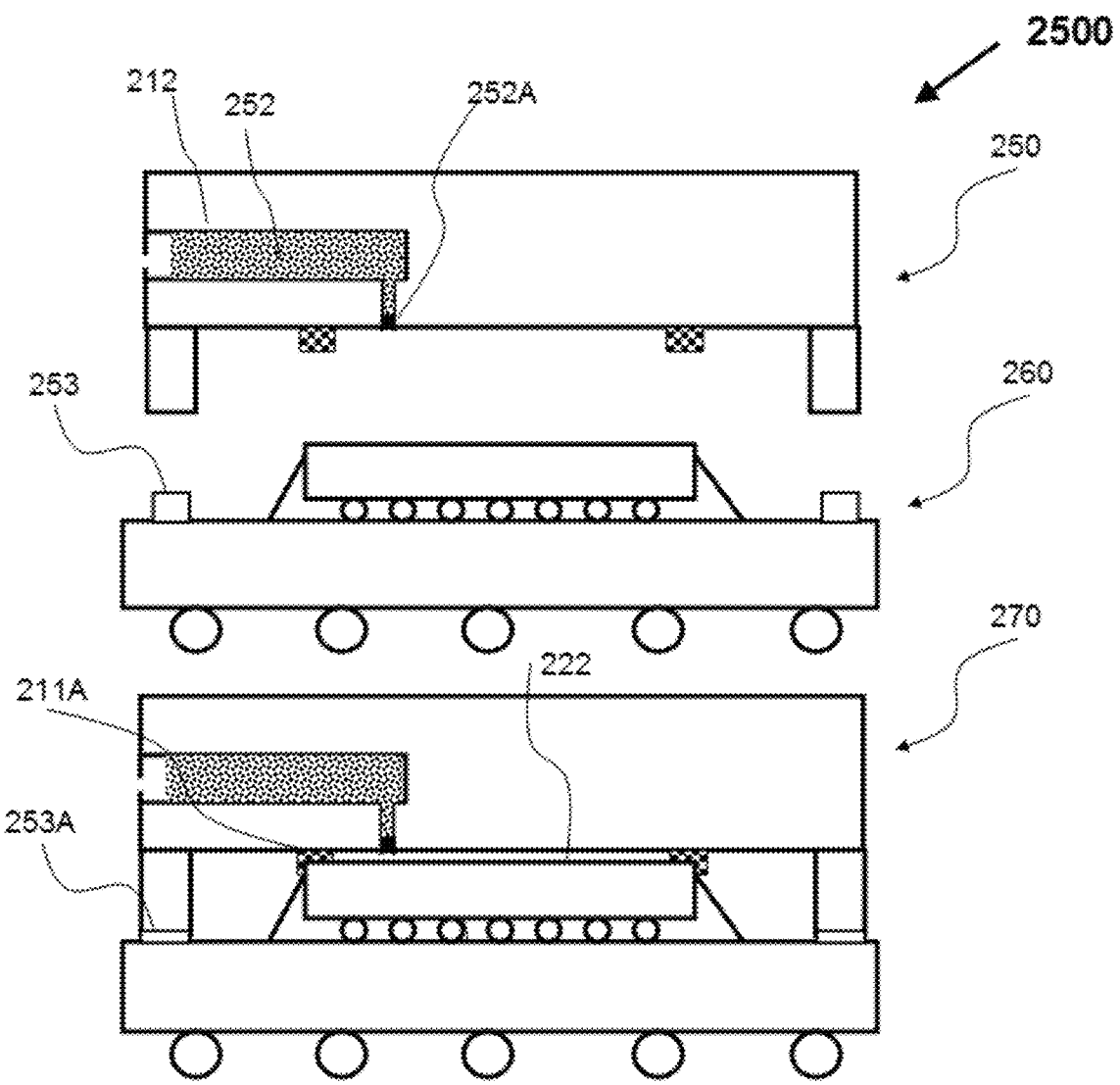
FIG. 4 is a schematic diagram for illustrating a way for using the present lid to form a lidded flip chip package with a liquid TIM of one embodiment of the present invention.

Referring to FIG. 3, a challenge to form the present lidded flip chip package 220 based on the lid 200 is for a liquid material to be fully filled in the sealed gap 222, and partially filled in the reservoir 212 without air trapped in the sealed gap 222. FIG. 4 is a schematic diagram for illustrating a way to form the lidded flip chip package 220 based on the lid 200 of one embodiment of the present invention, in which the numerical symbol 250 designates that the lid 200 as showed in FIG. 3 further includes a liquid material 252 pre-stored in its reservoir 212, and a low melting point of seal material 252A is used to seal the inner end of the connecting hole so that the liquid material 252 is held in place before the application of the lid, the 260 designates that an adhesive material 253 has been dispensed on the peripheral region of the substrate of the flip chip package for bonding the lid with the substrate, and the 270 designates that the lid 250 is attached onto the substrate in a vacuum condition and under a compression force so that the gap 222 becomes a vacuum gap tightly sealed by the seal ring 211A and the adhesive material 253 has extended into an adhesive layer 253A. Then, the assembly 270 is arranged to go through a curing process for curing the adhesive layer 253A in a high temperature and an ambient condition. Because the curing temperature is usually around 150° C. for about 1 hour or longer, the low melting point of seal material 252A for sealing the inner end of the connecting hole gets melted, and the connecting hole gets opened. As a result, the liquid material 252 is sucked into the sealed gap 222 due to the lower pressure in it as compared to the ambient pressure, forming the lidded flip chip package 220 with a liquid TIM as showed in FIG. 3. It is noted that for the way to form the present lidded flip chip package 220 as showed in FIG. 4, a liquid material of gallium alloy with melting point below room temperature and indium alloy material with melting point from 60° C. to 100° C. are preferred for the liquid material 252 and seal material 252A, respectively. It is also noted that the pure gallium can be selected for the liquid material 252 without using the seal material 252A. But before the application of the lid, the lid with the gallium 252 pre-stored in its reservoir 212 needs to be kept below 29.8° C., the melting point of the gallium so that the gallium 252 is in solid state without the concern of its leakage.

It is noted that the reservoir 212 of the lid 200 and its corresponding lidded flip chip package 222 as showed in FIG. 3 can be flexibly designed according to a specific application. A tunnel type of reservoir is preferred in the embodiments of the present disclosure so that air can be prevented from being trapped in the sealed gap 222. FIG. 5 to FIG. 13 are schematic diagrams for illustrating some tunnel type of reservoirs of the lid and lidded flip chip package of the preferred embodiments of the present disclosure. The preferred reservoirs include a pattern of tunnel based on a pattern of slots on the top or bottom surface of the top piece of the lid, a pattern of tunnel in the middle layer of the top piece of the lid, and a tube type of container outside the top piece of the lid, which will be described in conjunction with their drawings in the following.

Figure 5:
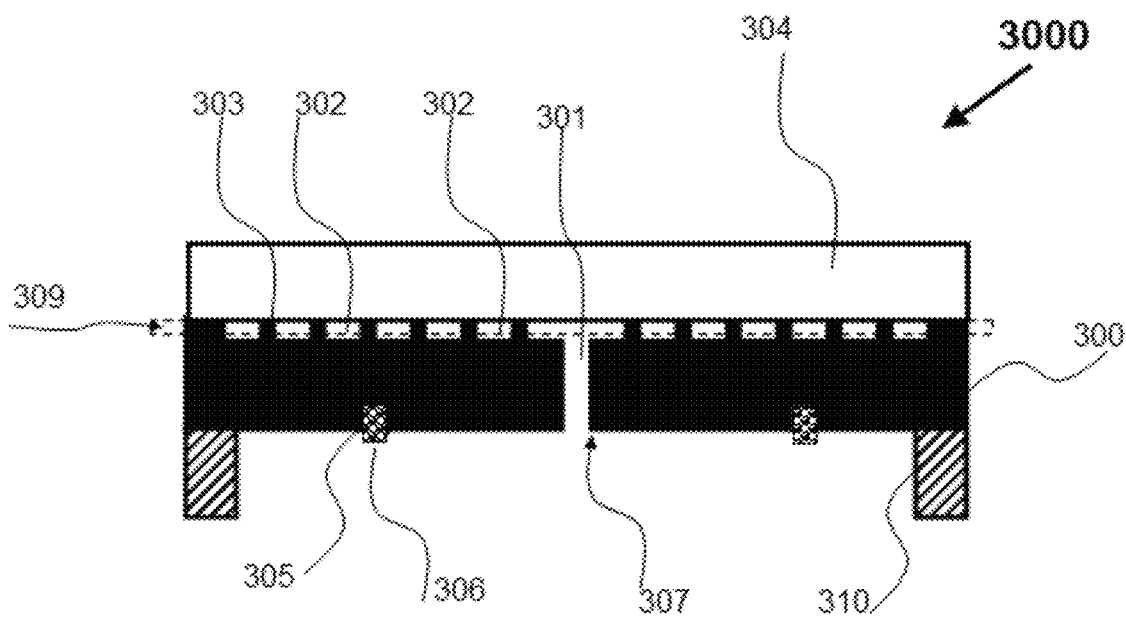
FIG. 5, FIG. 5A and FIG. 5B are schematic diagrams for illustrating a lid having a reservoir on its top surface from its cross-sectional, top and bottom views of one preferred embodiment of the present invention.
Figure 5A:
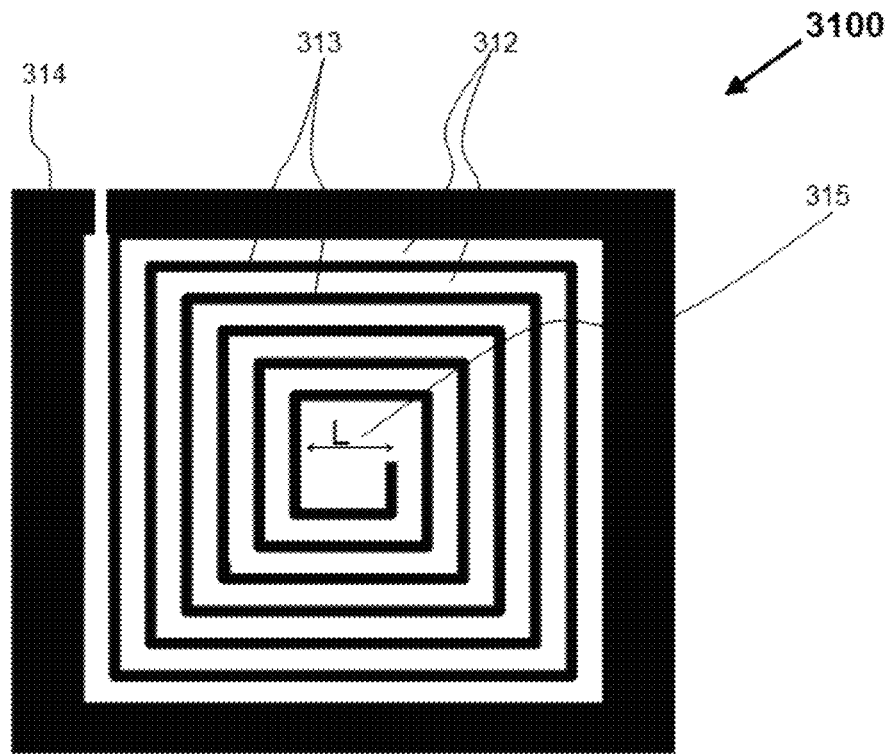
Figure 5B:
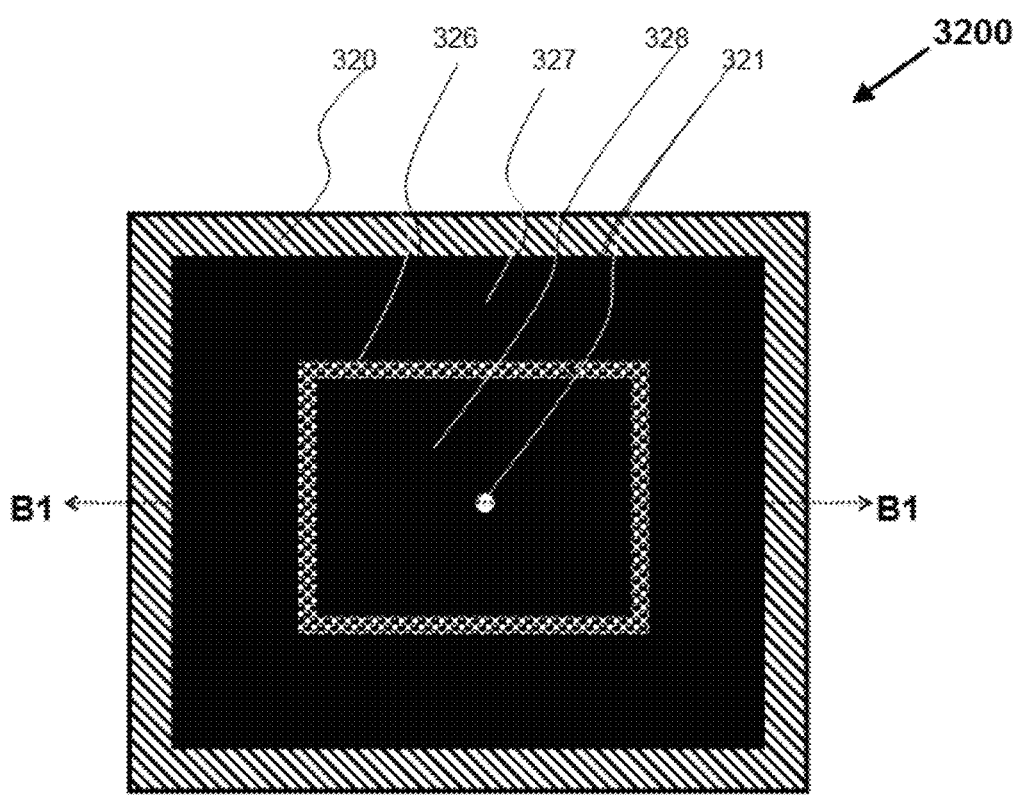

FIG. 5, FIG. 5A and FIG. 5B are schematic diagrams for illustrating a lid from its cross-sectional, top and bottom views of one preferred embodiment of the present invention, in which the reservoir of the lid is a pattern of tunnel based on a pattern of slots on the top surface of the top piece of the lid, and the pattern of slot is particularly a spiral pattern of slot. The numerical symbol 3000 in FIG. 5 designates the cross-sectional view of the lid, in which the 300 and 310 respectively designate its top piece and side wall, the 305 and 306 respectively designate a ring-type of slot on its bottom surface and a seal ring mounted in the ring-type of slot 305, the ring-type of slot 305 is for keeping the seal ring in place, 302 designates a spiral pattern of slot for a reservoir on the top surface of the lid, 301 designate a connecting hole, going through the top piece 300, 307 indicates that the connecting hole 301 starts from the seal ring region of bottom surface of the lid and connects to the spiral pattern of slot 302, the 309 designates the material layer in the rectangular dash line region, called a reservoir layer herein, which will be described from its top view for further clarifying the reservoir, and the 304 designates a removable covering piece, which covers the spiral pattern of slot 302, forming a spiral pattern of tunnel. The numerical symbol 3100 in FIG. 5A designates the top view of the reservoir layer 309 as showed in FIG. 5, in which the 312 designates the spiral pattern of slot 302 from its top view, 314 and 313 designate the materials of the reservoir layer 309 around and among the spiral pattern of slot 312, and the letter L indicated by 315 designates the size of the central opening of the spiral pattern of slot 312. The numerical symbol 3200 in FIG. 5B designates the bottom view of the lid, in which the 320 designates the side wall 310 in FIG. 5 from its bottom view, 321 designates the connecting hole 301 in FIG. 5 from its bottom view, 326 designates the seal ring 306 in FIG. 5 from its bottom view, the 327 and 328 designate the portions of the bottom surface of the lid outside and inside the seal ring 326, the portion of the bottom surface of the lid inside the seal ring 328 is called the seal ring region of bottom surface of the lid herein, the arrow dash line B1 to B1 designates the cross-sectional location for the cross-sectional view of the lid in FIG. 5.

It is noted that the reservoir layer 309 as showed in FIG. 5/5A is designable in its material and geometrical structure, and that a reservoir formed in a reservoir layer is preferred in the embodiments of the present disclosure. Some other variations for the reservoir layer 309 are described in conjunction with the drawings in FIG. 6 to FIG. 7 in the following. It is also noted that the purpose for the lid 3000 to have the removable covering piece 304 as showed in FIG. 5 will be explained in conjunction with the drawing of a lidded flip chip package using the lid in FIG. 8/8A below.

Figure 6:
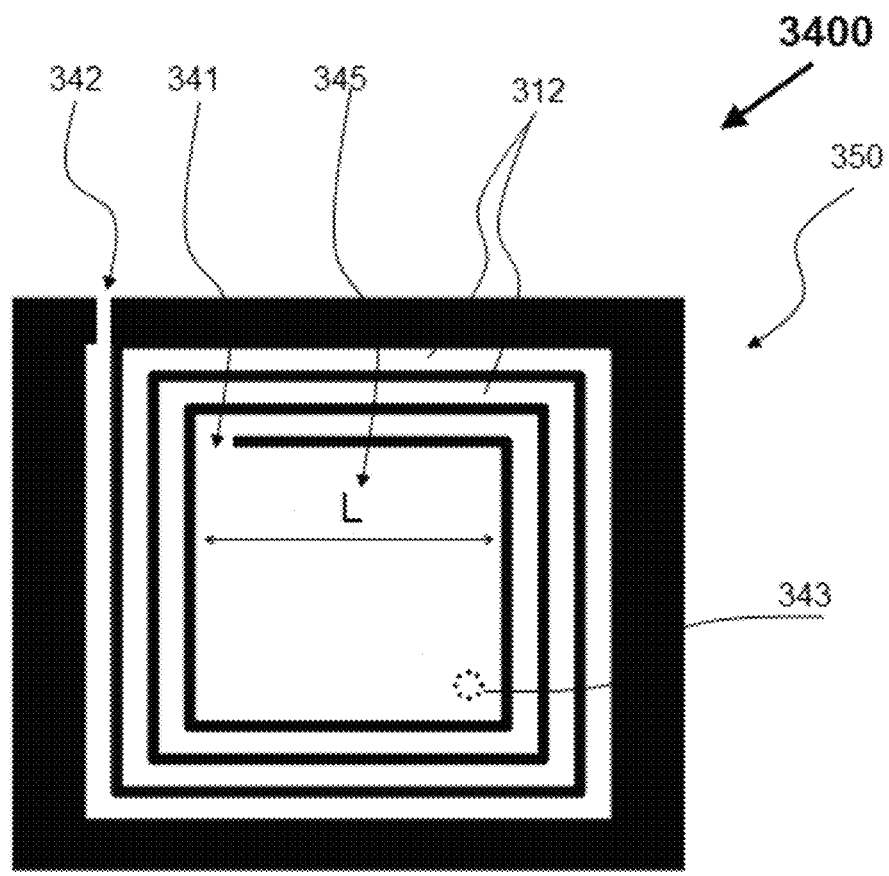
FIG. 6 and FIG. 6A are schematic diagrams for illustrating some variations for the reservoir on the top surface of a lid from its cross-sectional and top views of another preferred embodiment of the present invention.
Figure 6A:
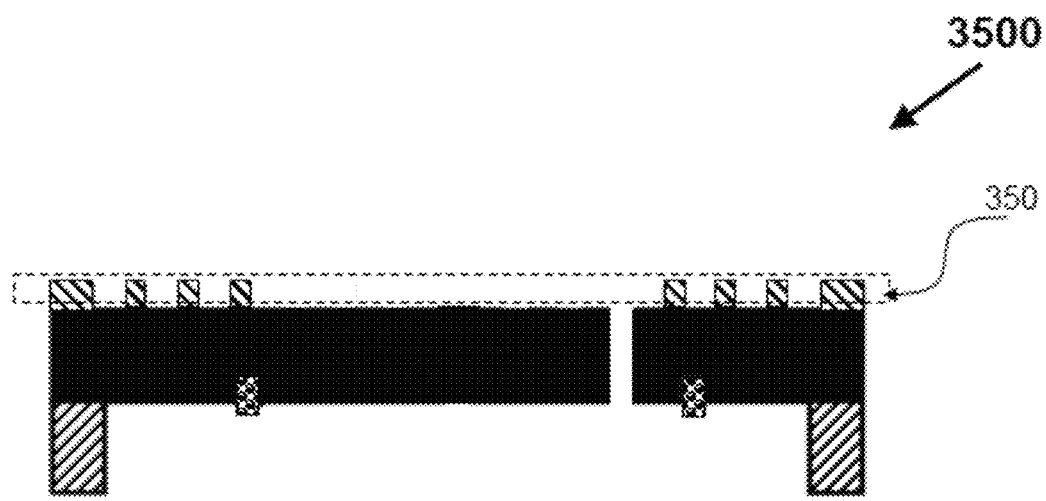
Figure 7:
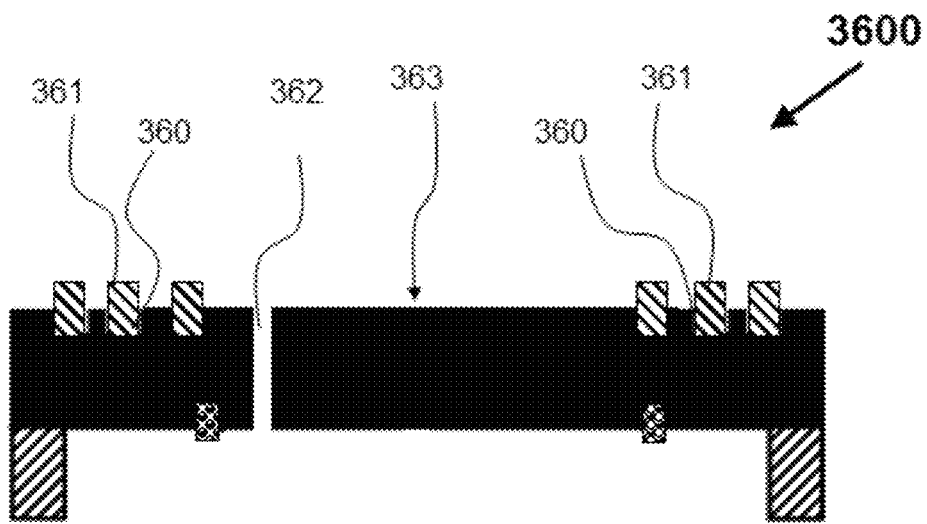
FIG. 7 and FIG. 7A are schematic diagrams for illustrating a reservoir on the top surface of a lid from its cross-sectional and top views of another preferred embodiment of the present invention.
Figure 7A:
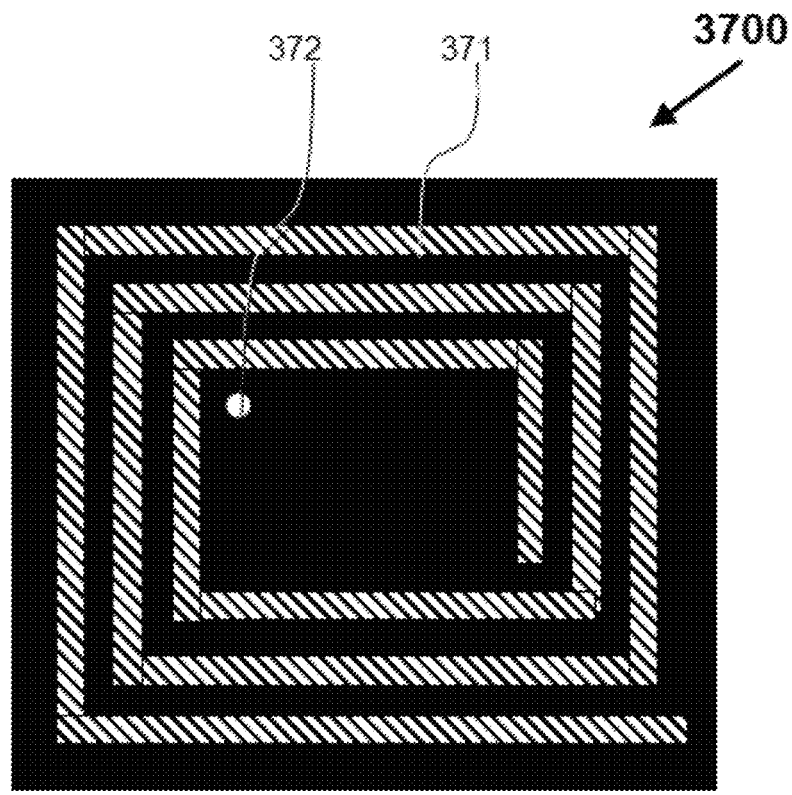

FIG. 6 and FIG. 6A are schematic diagrams for illustrating some variations in material and geometry for the reservoir layer 309 as showed in FIG. 5 and FIG. 5A of one preferred embodiment of the present invention. The numerical symbol 3400 in FIG. 6 designates the top view of a reservoir layer 350, in which the arrow line with letter L designated by the 345 illustrates that the spiral pattern of slot 312 has a bigger central opening as compared to that in FIG. 5A, the 341 and 342 designate the inlet and outlet of the spiral pattern of slot 312, the 343 illustrates that the connecting hole 301/321 in FIG. 5 and FIG. 5A is accordingly re-positioned at the opposite corner from the inlet 341 in the central opening of the spiral pattern of slot 312. The numerical symbol 3500 in FIG. 6A designates the cross-sectional view of a lid with the reservoir layer 350 as showed in FIG. 6, in which a layer of different material from the top piece of the lid is used for forming the reservoir layer 350. It is noted that a layer of different material having a pattern of slots can be printed on the top surface of the lid to form a reservoir layer. FIG. 7 and FIG. 7A are schematic diagrams for illustrating a lid with a reservoir layer of another preferred embodiment of the present invention. The numerical symbol 3600 in FIG. 7 designates the cross-sectional view of the lid, in which the 361 designates a spiral pattern of thread arranged in a spiral pattern of slot on the top surface 363 of the lid, and the 362 designates a connecting hole through the top piece of the lid. It is noted that the spiral pattern of thread 361 forms a reservoir layer, and the gaps among the spiral pattern of thread 361 forms a reservoir of the lid for storing or providing a liquid material. The numerical symbol 3700 in FIG. 7A designates the top view of the lid, in which the 371 and 372 designates the spiral pattern of thread 361 and connecting hole 362 in FIG. 7 from their top views.

It is noted that it has some specific benefits to use a layer of different material to make a reservoir layer on the top surface of the lid. For example, a rubber-like material can be selected to form the spiral pattern of thread 361 for the reservoir layer of the lid as showed in FIG. 6, and a layer of different material with a specific pattern of opening can be printed on the top surface of the lid.

Figure 8:
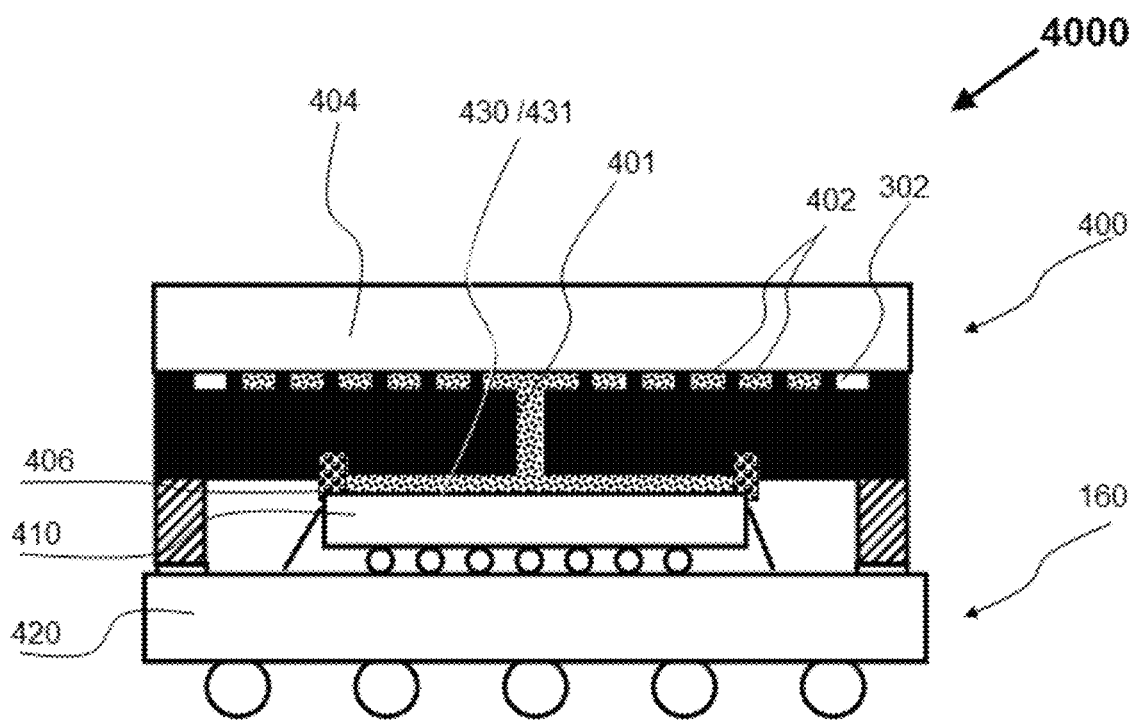
FIG. 8 and FIG. 8A are schematic diagrams for illustrating a lidded flip chip package with a liquid TIM based on the lid having a reservoir on its top surface of one preferred embodiment of the present invention.

FIG. 8 is a schematic diagram for illustrating a lidded flip chip package with a liquid TIM based on the lid having a reservoir on its top surface of one preferred embodiment of the present invention. The numerical symbol 4000 in FIG. 8 designates a lidded flip chip package with a liquid TIM, in which the 400, and 160 designate a lid and a flip chip package, the flip chip package 160 consists of a flip chip 410 and a substrate 420, the lid 400 is attached on the peripheral region of top surface of the substrate 420, covering the flip chip 410, the seal ring 406 seals the gap between the flip chip 410 and the lid 400, forming a sealed gap 430, the lid 400 includes a spiral pattern of slot 302 on its top surface for a reservoir, a removable covering piece 404 covers the spiral type of slot 402 for it to become a spiral pattern of tunnel, a liquid material is fully filled in the sealed gap 430 and partially filled in the spiral pattern of slot 302. The liquid material 431 in the sealed gap 430 forms a liquid TIM, thermally connecting the top surface of the flip chip 410 with the bottom surface of the lid 400, while the liquid material 402 partially filled in the spiral pattern of slot 302 can be used as a liquid TIM to connect the lid with a heat-dissipating object, like a heat sink, and the lid includes a connecting 401, which is between the sealed gap 430 and the spiral type of tunnel 302 for connecting one with the other.

Figure 8A:
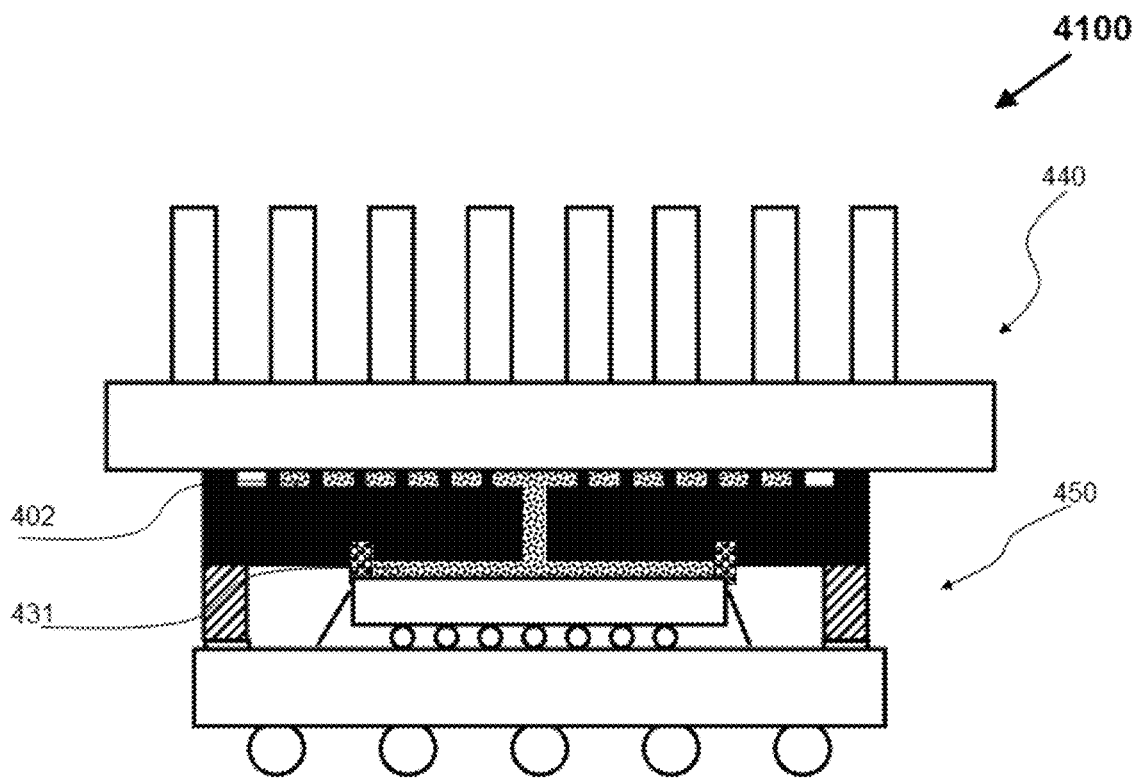

It is noted that the purpose for the lid or the lidded flip chip package to include the removable covering piece 404 as showed in FIG. 8 is for protecting the liquid material 402 in the spiral pattern of slots 302. As a result, the lidded flip chip package 4000 can be transported or tested without the concern for the leakage of the liquid material 402. In the field application of the lidded flip chip package 4000, the removable covering piece 404 can be replaced by a heat sink so that the liquid material 402 in the spiral pattern of slots 302 can be used as the TIM between the lid and the heat sink, which is illustrate by the schematic diagram 4100 in FIG. 8A, in which the 450 designates that the removable covering piece 404 in the lidded flip chip package 4000 in FIG. 8 is replaced by a heat sink 440. So, it is seen that a benefit from the lid having a reservoir on its top surface is that the same liquid material can be used for both TIM1 and TIM2 of the lidded flip chip package.

Figure 9:
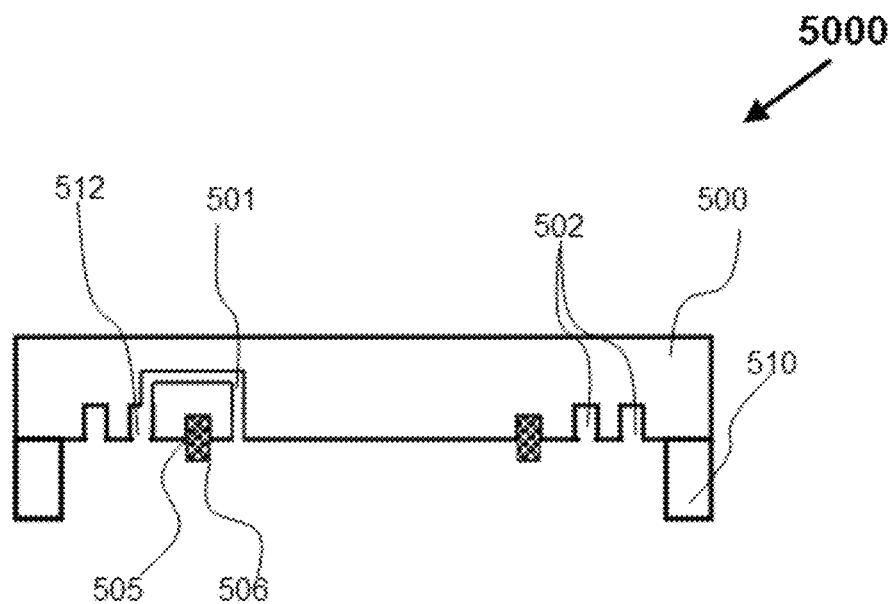
FIG. 9, FIG. 9A and FIG. 9B are schematic diagrams for illustrating a lid having a reservoir on its bottom surface from its cross-sectional and bottom views of one preferred embodiment of the present invention.
Figure 10:
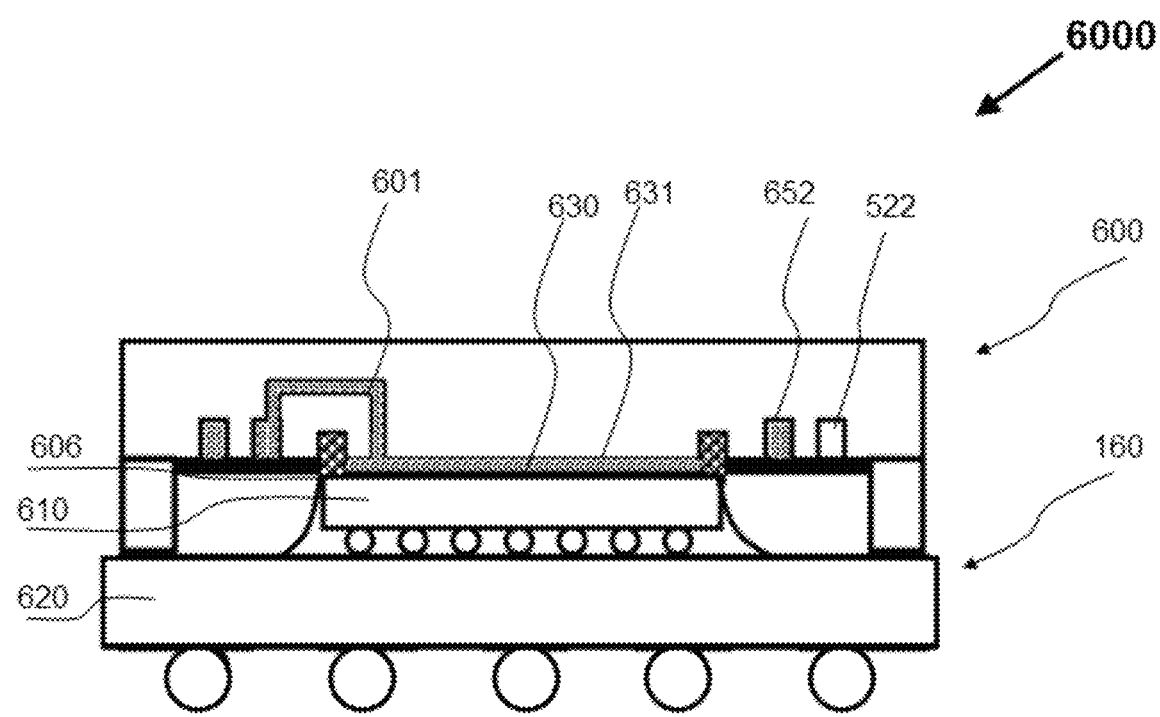
FIG. 10 is a schematic diagram for illustrating a lidded flip chip package with a liquid TIM based on the lid having a reservoir on its bottom surface of one preferred embodiment of the present invention.

FIG. 9 to FIG. 10 are schematic diagrams for illustrating a lid and its corresponding lidded flip chip package of another preferred embodiment of the present invention, in which the reservoir is formed on the bottom surface of the lid.

Figure 9A:
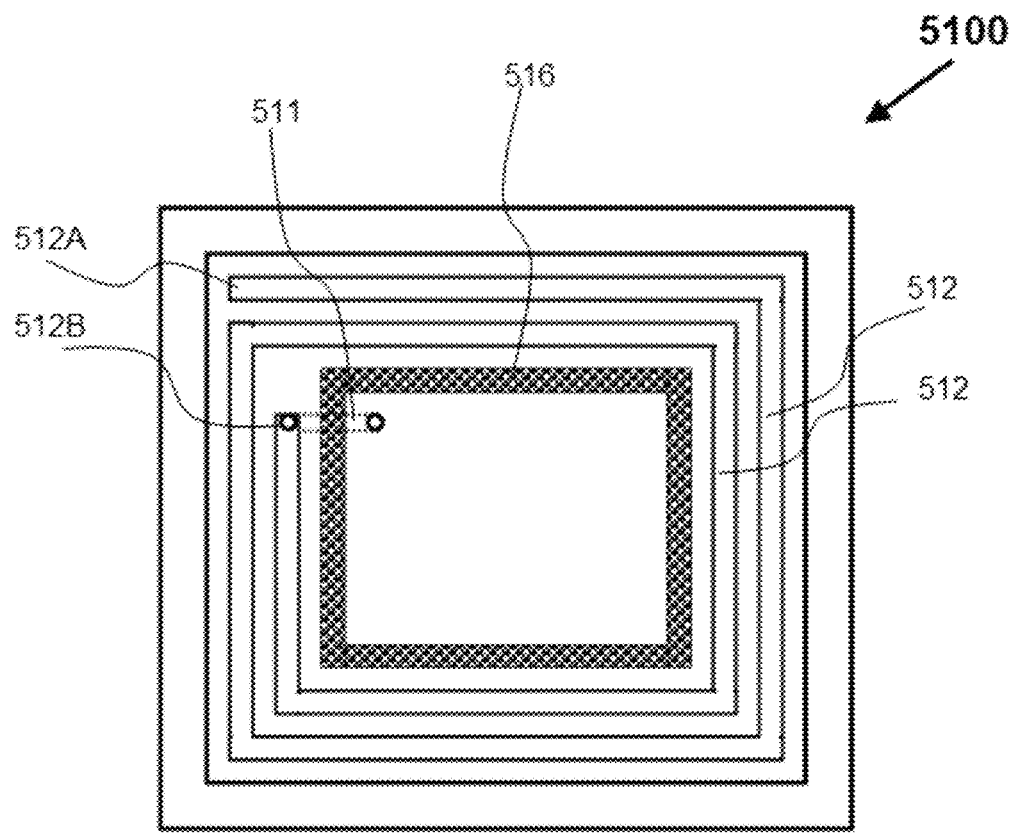
Figure 9B:
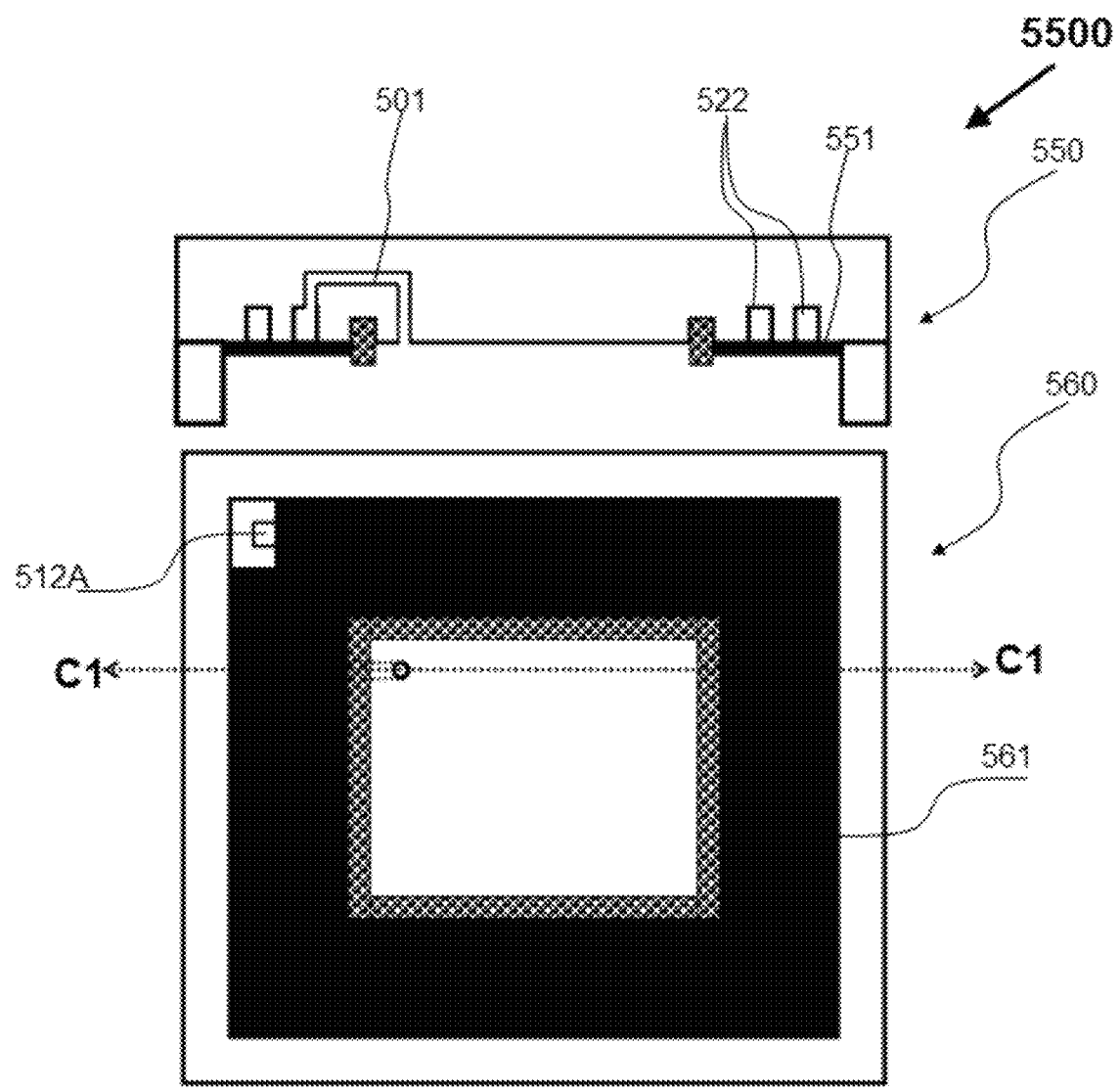

FIG. 9, FIG. 9A and FIG. 9B are schematic diagrams for illustrating the lid from its cross-sectional and bottom views. The numerical symbol 5000 in FIG. 8 designates the cross-sectional view of the lid, in which the 500 and 510 respectively designate the top piece and side wall of the lid, 505 and 506 respectively designate a ring-type of slot on the bottom surface of the top piece 500 and a seal ring mounted in the ring-type of slot 505, 502 designates a spiral pattern of slot on the bottom surface and around the seal ring region, 501 designate a curved connecting hole in the lid, starting from the seal ring region of bottom surface of the lid and going out to connect with the spiral pattern of slot 502, and 512 designates that the tunnel 501 connects with the spiral pattern of slot 502. The numerical symbol 5100 in FIG. 9A designates the bottom view of the lid, in which the 512 designates the spiral pattern of slot 502 in FIG. 9 from its bottom view, 512A and 512B designate the outlet and inlet of the spiral pattern of slot 512, 511 designate the connecting hole 501 from its bottom view, and the 516 designate the seal ring 506 from its bottom view. The numerical symbol 5500 in FIG. 9B designates that the lid 5000/5100 showed in FIG. 9/9A further includes a covering piece, in which the 550 and 560 designate the cross-sectional and bottom views of the lid, the 551 and 561 designate the covering piece from its cross-sectional and bottom views, which is bonded on the bottom surface of the lid, covering the spiral pattern of slot 502 as showed in FIG. 9 so that the slot 502 becomes a spiral pattern of tunnel 512. It is noted that the outlet 512A of the slot 512 should be opened to the ambient without being covered, and the arrow dash line C1 to C1 designates the cross-sectional location for the cross-sectional view 550 of the lid 5500.

FIG. 10 is a schematic diagram for illustrating a lidded flip chip package using the lid 5500 in FIG. 9, in which the numerical symbol 6000 designates the cross-sectional view of the lidded flip chip package, which comprises a flip chip package 160 and a lid 600, and a reservoir system, the flip chip package 160 includes a flip chip 610 and a substrate 620, the lid includes a seal ring 606 on the bottom surface of the lid, which seals the gap between the flip chip 610 and the lid 600, forming a sealed gap 630, the lid includes a reservoir, that is a spiral pattern of tunnel 522 on the bottom surface of the lid and around the sealed gap 630, a curved tunnel 601 connects the sealed gap 630 with the spiral pattern of tunnel 522, and a liquid material is fully filled in the sealed gap 630 and partially filled in the spiral pattern of tunnel 522, the 631 designates the liquid material filled in the sealed gap 630, forming the TIM between the flip chip 610 and the lid 600, and the 652 designates the liquid material partially filled in the spiral pattern of tunnel 522.

Figure 11:
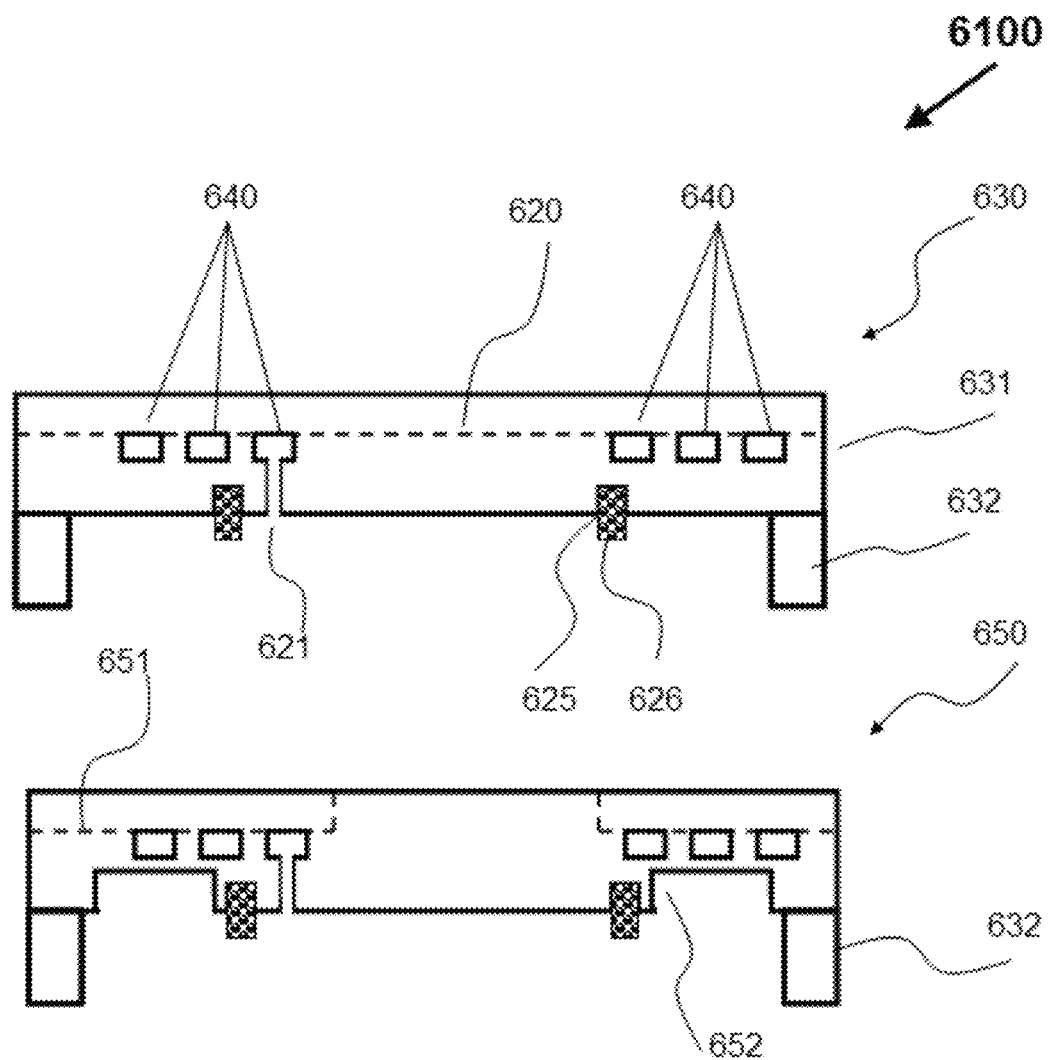
FIG. 11 is a schematic diagram for illustrating a lid having a pattern of tunnel in the middle layer of region of its top piece and a way for making it of one preferred embodiment of the present invention.

FIG. 11 is a schematic diagram for illustrating a lid having a pattern of tunnel in the middle layer region of the top piece of the lid and a way for making it of another preferred embodiment of the present invention. The lid designated by the numerical symbol 630 in FIG. 11 includes a top piece 631, a side wall 632, a seal ring 626 mounted in a ring-type of slot 625 on the bottom surface of the lid, a tunnel type of reservoir 640 inside the top piece 631, and a connecting hole 621, starting from the seal ring region of bottom surface and connecting to the reservoir. The dash line 620 in the lid 630 illustrates that the top piece 631 and the tunnel type of reservoir 640 are formed by bonding two pieces of metal together. Of the two piece of metal, the bottom one has a pattern of slots, which forms the tunnel type of reservoir 640 after being covered by the top piece of metal. It is noted that a tunnel type of reservoir on the top or bottom surface of a lid can be formed through cutting a slot on the top or bottom surface of a lid. The lid designated by the numerical symbol 650 in FIG. 11 illustrates some variations from the lid 630, in which the dash line 651 illustrates that the top piece of metal is a ring-type of piece, and the 652 illustrates a step type of cutting on the bottom surface of the lid and outside the seal ring region.

Figure 12:
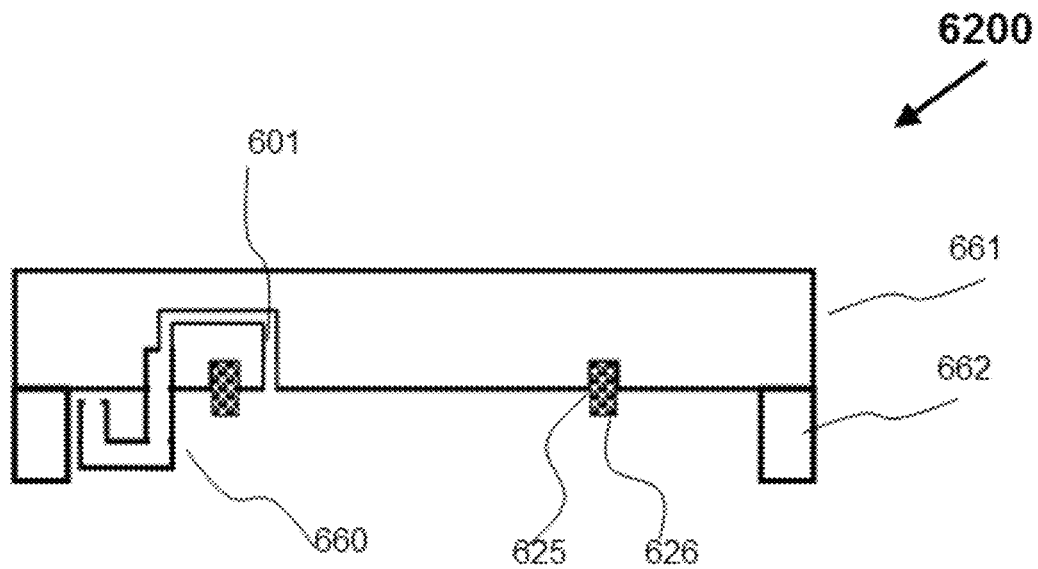
FIG. 12 is a schematic diagram for illustrating a lid having a reservoir outside the lid body of another preferred embodiment of the present invention.

FIG. 12 is a schematic diagram for illustrating a lid of one preferred embodiment of the present disclosure, in which the reservoir is a tube type of container outside the lid body. The lid designated by the numerical symbol 6200 in FIG. 12 includes a top piece 661, a side wall 662, a seal ring 626 arranged in a ring-type of slot 625 on the bottom surface of the lid, a tube type of reservoir 650 outside the lid body, and a connecting hole 601, starting from the seal ring region of bottom surface and connecting to the tube type of reservoir 650. It is noted that many variations can be designed for a container outside the lid body. For example, a lid has two connecting holes and a pump type of container having two tubes connects to the two connecting holes so that a liquid material can be circulated from the pump type of container, forming a dynamic TIM when applying the lid for a lidded flip chip package.

It is noted that according to the spirit and scope of the present disclosure, many other modifications and variations can be made. Some examples of the modifications and variations are given to further describe the present invention. The reservoir included in the lid is not limited to be one cavity and the number of the connecting hole is not limited to be one. A reservoir consisting of two tunnels with each being connected with one connecting hole is described as an example in FIG. 13. The lidded flip chip package with a liquid TIM is not limited to only include a single flip chip. A module consisting of multiple chips is described as an example in FIG. 14. A lidded flip chip package having multiple separate chips is described in FIG. 15. And a heat sink having a reservoir structure for a flip chip package to use a liquid TIM is described in FIG. 16.

Figure 13:
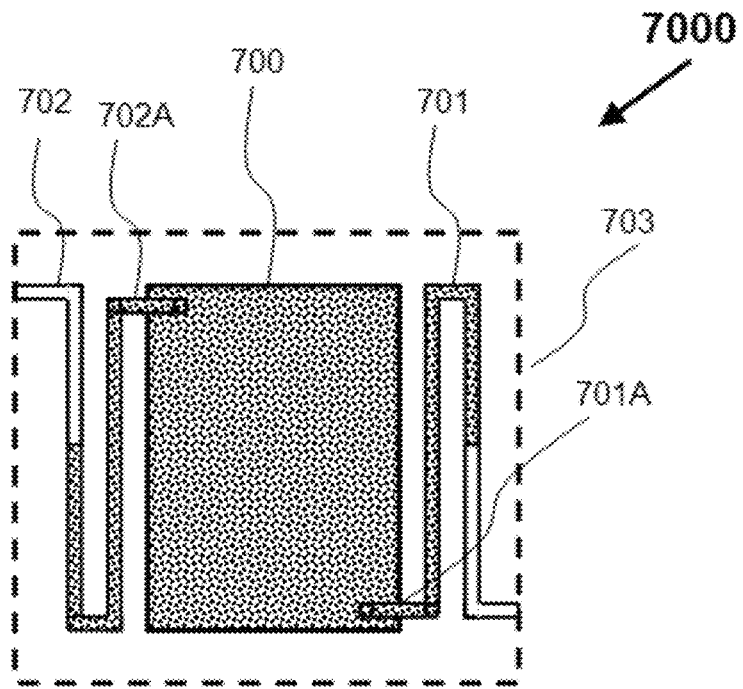
FIG. 13 is a schematic diagram for illustrating a reservoir system consisting of multiple tunnels and multiple connecting holes of another preferred embodiment of the present invention.

FIG. 13 is a schematic diagram for illustrating a reservoir in a lid and a reservoir system in an associated lidded flip chip package, wherein the reservoir consists of two tunnels. The numerical symbol 7000 in FIG. 13 designates a reservoir system, in which the 700 designates the sealed gap with a liquid TIM, the 701 and 702 designate two folding pattern of tunnels, forming a reservoir, 701A and 702A designate two connecting holes, each connecting one folding pattern of tunnel with the sealed gap 700, and the rectangular dash line illustrates the region of the top piece of the lid. It is noted that a benefit of such a reservoir system is that a liquid material can be injected into it from one tunnel without the need of a vacuum condition after the lid with the reservoir structure is attached to the flip chip package. Summarily, the reservoir included in the lid of present invention can be a cavity or particularly be one or more tunnels inside the lid, the one or more tunnels can be formed through one or more slots on the top or bottom surface of the top piece of the lid, the top piece of the lid can further comprises a reservoir layer, in which the reservoir is formed, referring to FIG. 3 to FIG. 13.

Figure 14:
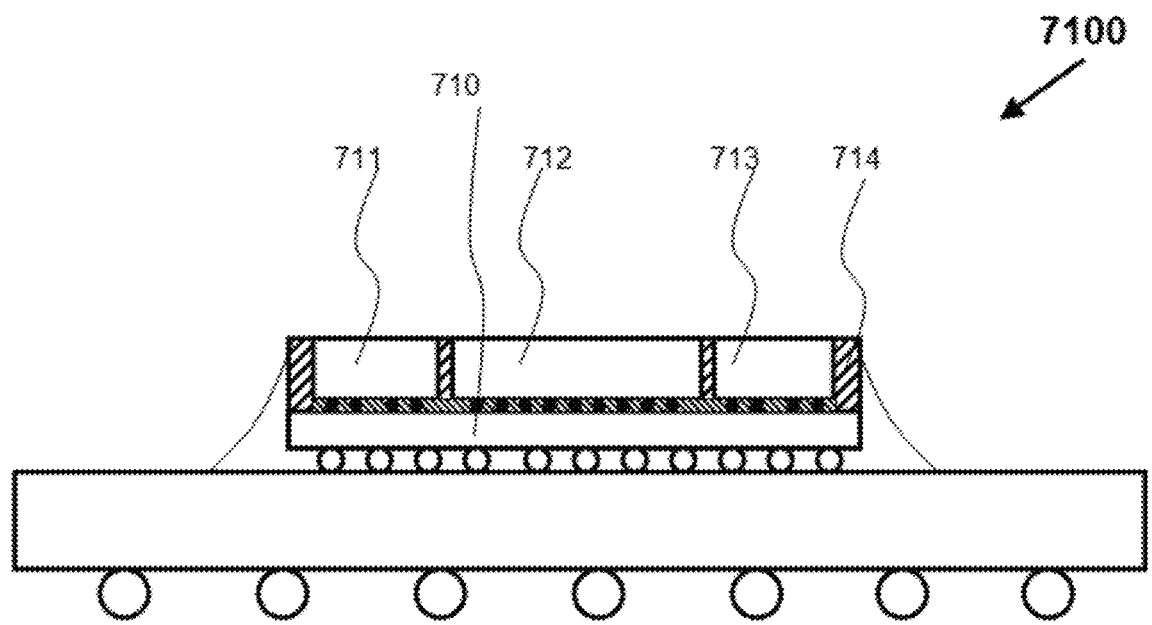
FIG. 14 is a schematic diagram for illustrating that a multiple chip module can be viewed as a single flip chip for the lidded flip chip package with a liquid TIM of one preferred embodiment of the present invention.

FIG. 14 is a schematic diagram for explaining the flip chip may be a module consisting of multiple chips in the scope of the present disclosure. The numerical symbol 7100 in FIG. 14 designates a module consisting of multiple chips, in which the multiple chips 711, 712 and 713 are integrated as a module through an interposer chip 710 and a molding material 714. When applying a lid of the embodiments of present invention to such a flip chip package to form a lidded flip chip package using a liquid TIM, the lid can be similarly applied by viewing the module as one chip. So, the flip chip in the scope of the present disclosure is not limited to a single chip, but includes the module with multiple chips or generally a heat-generating object with a continuous top surface.

Figure 15:
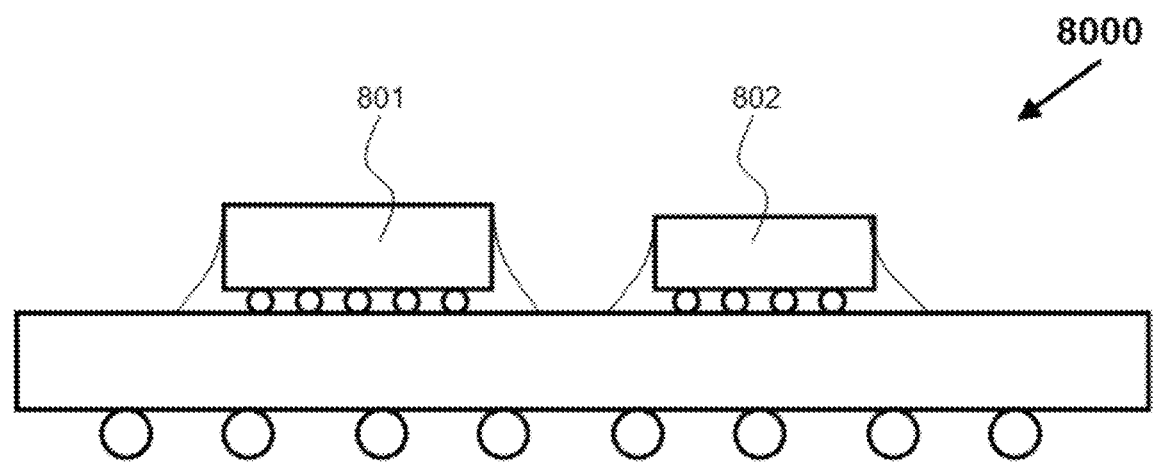
FIG. 15, FIG. 15A and FIG. 15B are schematic diagrams for illustrating a lidded flip chip package with a liquid TIM for the case of multiple flip chips of another preferred embodiment of the present invention.
Figure 15A:
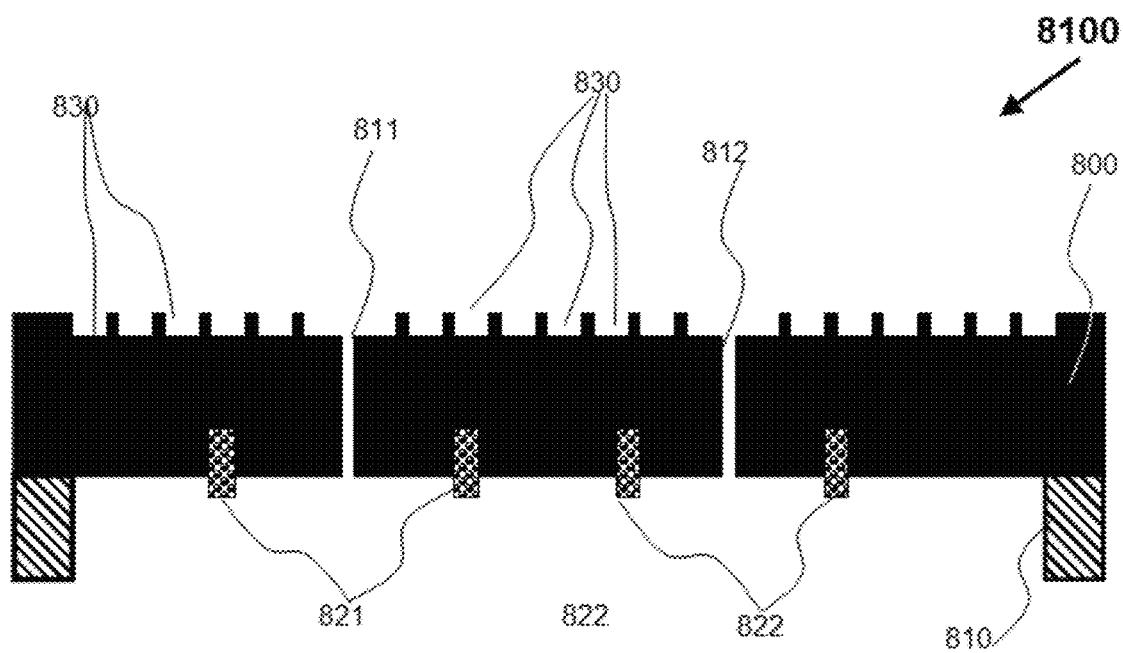
Figure 15B:
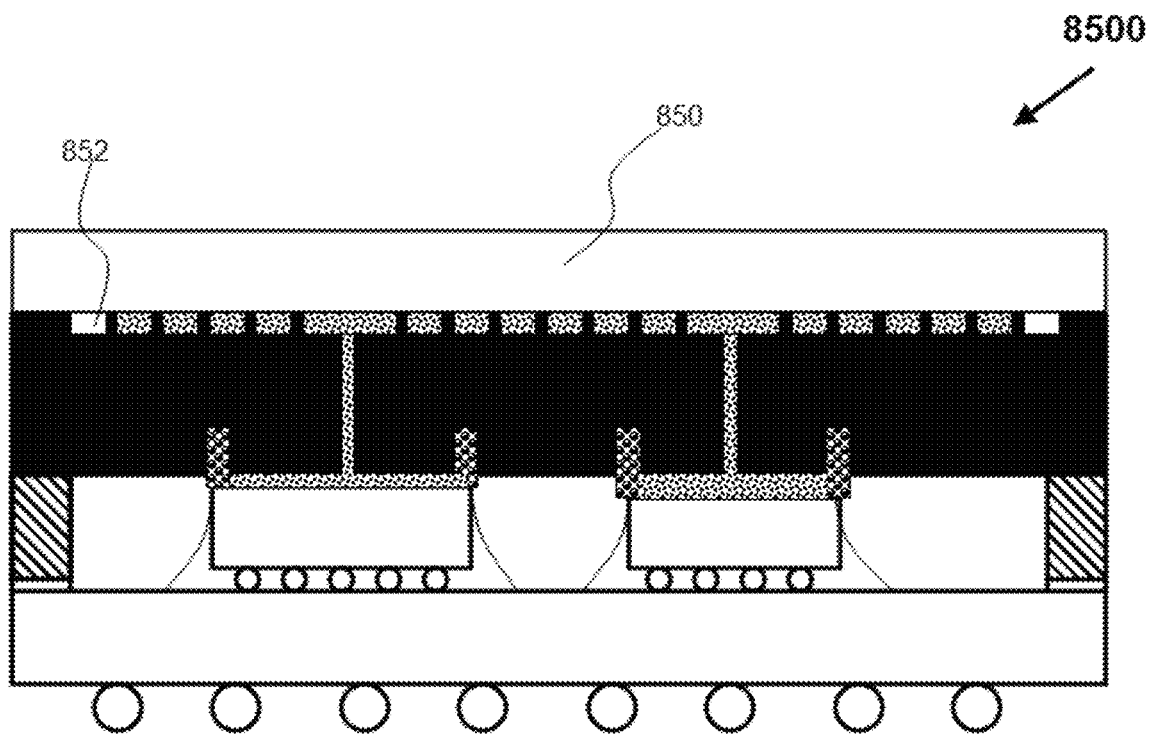

FIG. 15, FIG. 15A and FIG. 15B are schematic diagrams for illustrating the case of a lidded flip chip package having multiple separate chips of one embodiment of the present disclosure. The numerical symbol 8000 in FIG. 15 designates a flip chip package having multiple chips, in which the 801 and 802 designate the multiple chips. The numerical symbol 8100 in FIG. 15A designates the cross-sectional view of a lid according to the multiple chips 801 and 802 of the flip chip package 8000, in which the 800 and 810 respectively designate the top piece and side wall of the lid, 821 and 822 designate multiple seal rings 821 and 822 on the bottom surface of the top piece 800 according to the multiple chips 801 and 802, 830 designates a spiral pattern of slot on the top surface of the lid for forming a reservoir in its application for a lidded flip chip package, and for each seal ring, a connecting hole starts from the seal ring region of the bottom surface of the lid and connects to the spiral pattern of slot 830. The numerical symbol 8500 in FIG. 15B designates the cross-sectional view of a lidded flip chip package, which is formed by attaching the lid 8100 as showed in FIG. 15A to the flip chip package 8000 as showed in FIG. 15. In the lidded flip chip package, a removable covering piece 850 is attached to cover the spiral pattern of slot 830 in FIG. 15A, forming a spiral pattern of tunnel 852 as a reservoir, and a liquid material is fully filled in all the sealed gaps and partially filled in the spiral pattern of tunnel 852.

Figure 16:
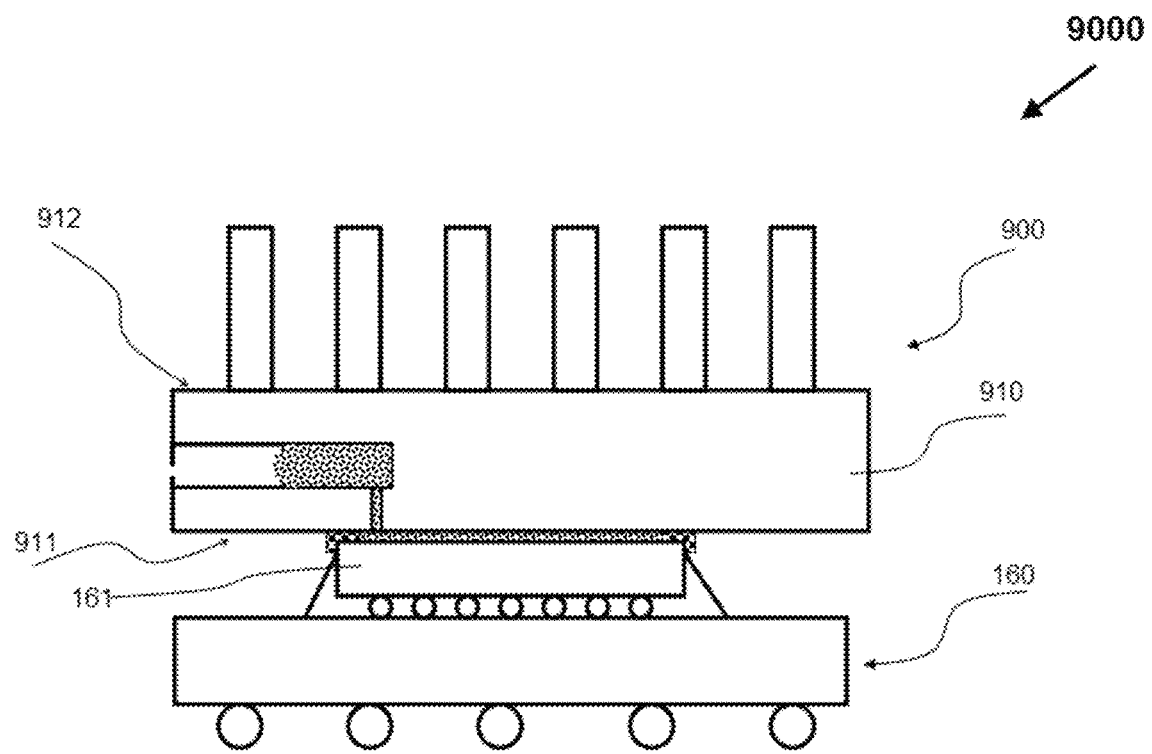
FIG. 16 is a schematic diagram for illustrating a heat sink having a reservoir structure for a flip chip package to use a liquid TIM of another preferred embodiment of the present invention.

FIG. 16 is a schematic diagram for illustrating a heat sink having a reservoir structure for a flip chip package to use a liquid TIM of another preferred embodiment of the present invention. The numerical symbol 9000 in FIG. 16 designates a heat sink having a reservoir structure for a flip chip package to use a liquid TIM, in which the numerical symbols 900 and 160 designate a heat sink having a reservoir structure and a flip chip package attached with the heat sink. As a result, a reservoir system is formed, giving a liquid TIM between the flip chip 161 and the base plate 910 of the heat sink, in which the 911 and 922 designate the bottom and top surface of the base plate 910, and 913 designates the fins on the top surface 912 of the base plate 910. The descriptions for the reservoir structure and the reservoir system can be referred to those in conjunction with the drawings in FIG. 3, and not repeated herein.

The reservoir structure comprising of a seal ring, a connecting hole and one or more tunnels in the base plate of a lid or a heat-dissipating object is described in the preceding in conjunction with the drawings from FIG. 3 to FIG. 16. A reservoir structure comprising of a seal ring, a connecting hole, a liquid-storage tube and one or more air-vent tubes is described in the following in conjunction with the drawings from FIG. 17 to FIG. 33. A heat-dissipating object with the reservoir structure can allow for a liquid thermal interface material (TIM) between the heat-dissipating object and an electronic device so that the heat generated in the electronic device can be efficiently transferred to the base plate of the heat-dissipating object.

Figure 17:
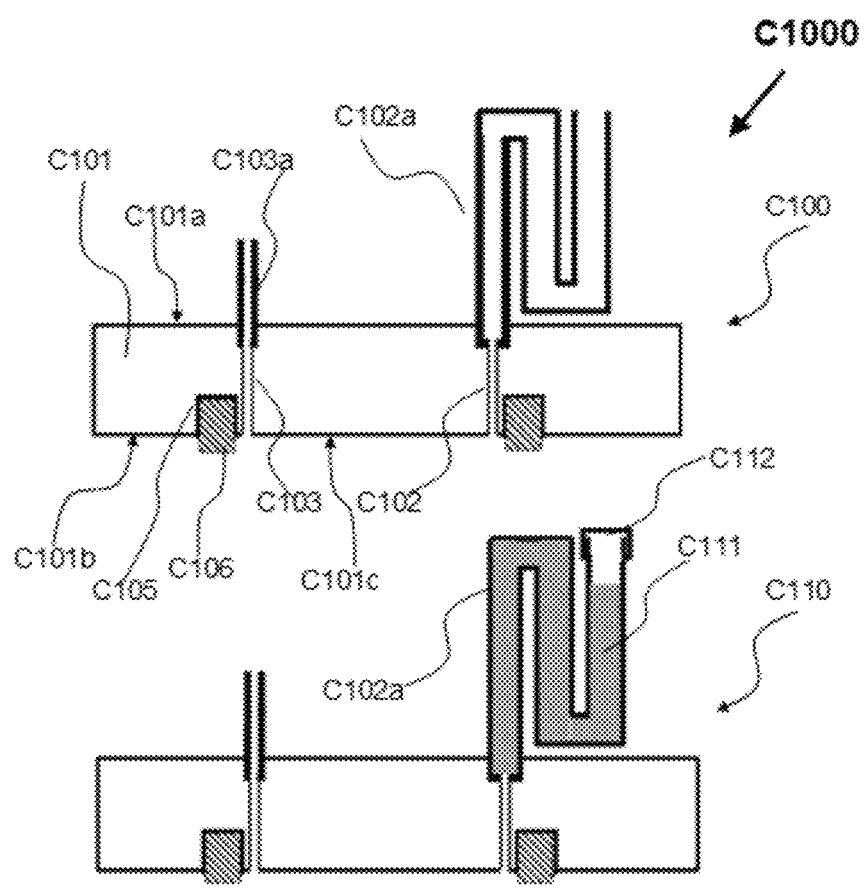
FIG. 17 is a schematic diagram for illustrating some basic features of a heat-dissipating object with a reservoir structure of one preferred embodiment of the present invention.

FIG. 17 is a schematic diagram for illustrating some basic features of a heat-dissipating object with a reservoir structure, comprising: a seal ring, a liquid-storage tube, one or more air-vent tubes, a connecting hole for each tube. The numerical symbol C1000 in FIG. 17 designates a base plate of a heat-dissipating object with a reservoir structure for an electronic device to use a liquid TIM, in which C100 illustrates a base plate C101 of a heat-dissipating object assembled with a reservoir structure, including C105, C106, C102, C102a, C103, and C103a. The base plate C101 has a top surface C101a and a bottom surface C101b. Depending on what is assembled on and above the top surface C101a of the base plate C101 for building a heat-dissipating object, the heat-dissipating object can be a heat sink, a cold plate or a vapor chamber, which will be further illustrated below. The reservoir structure includes a seal ring C106 mounted in a slot C105 in a ring form on the bottom surface C101b of the base plate C101, a liquid-storage tube C102a, one or more air-vent tubes C103a, a connecting hole C102 in the base plate C101 for connecting with the liquid-storage tube C102a, and one or more connecting holes C103 in the base plate C101 for connecting with the one or more air-vent tubes C103a. Each connecting hole C102 or C103 has two ends, one end is at a portion of the bottom surface of the base plate surrounded by the seal ring, which is called its inner end, and the other end is outside the bottom surface of the base plate surrounded by the seal ring, and may be at a portion of the top surface of the base plate, which is called its outer end. Each tube has two ends. The outer end of the connecting hole C102 or C103 connects with one end of the liquid-storage tube C102a or the one or more air-vent tubes C103a, which is called the inner end of the liquid-storage tube C102a or the one or more air-vent tubes C103a, and the other end is called the outer end of the liquid-storage tube C102a or the one or more air-vent tubes C103a. The configuration of the connecting holes C102 and C103 illustrated in FIG. 17 is a through hole from the bottom surface to the top surface of the base plate C101. Some other configurations of the connecting holes C102 and C103 will be further illustrated below. C110 in FIG. 17 is for illustrating some more features associated with the liquid-storage tube C102a, in which C111 and C112 designate a liquid material pre-stored in the liquid-storage tube C102a and a cap for closing the outer end of the liquid-storage tube C102a, respectively. It is noted that the liquid-storage tube C102a is in a folding form as an example, which can be designed in other forms according to the room available for placing it in a specific application.

Figure 18:
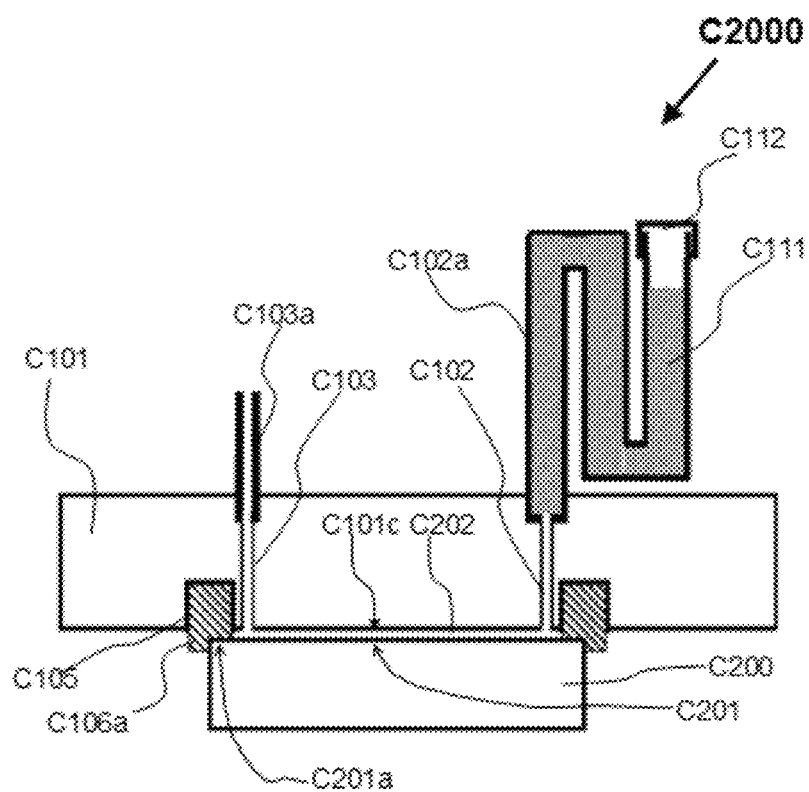
FIG. 18 to FIG. 21 are schematic diagrams for illustrating an assembly process for assembling the heat-dissipating object with an electronic device, providing a liquid thermal interface material (TIM) of another preferred embodiment of the present invention.
Figure 19:
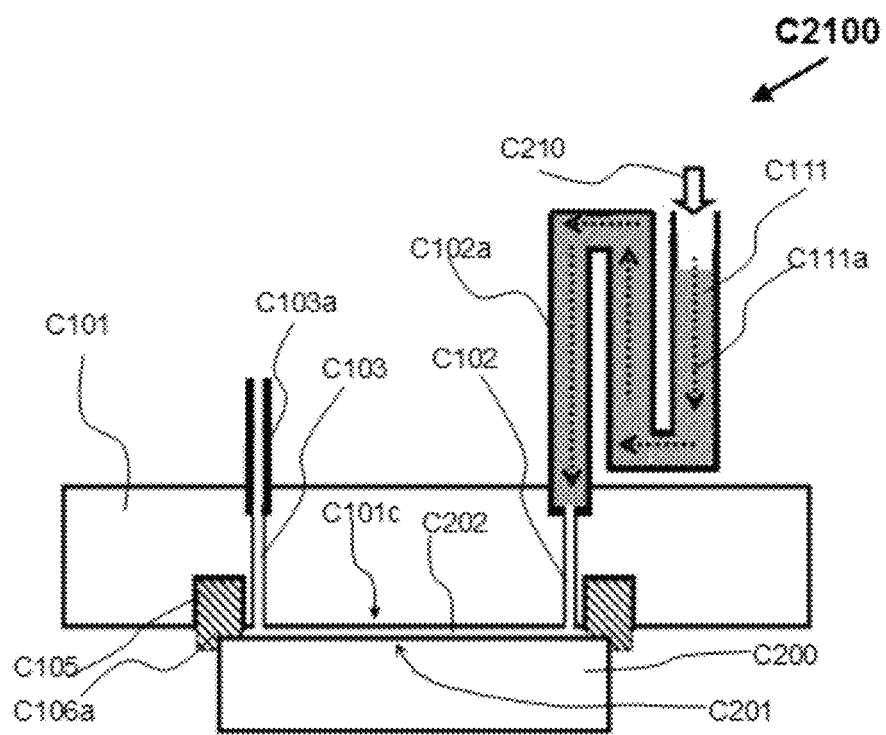
Figure 20:
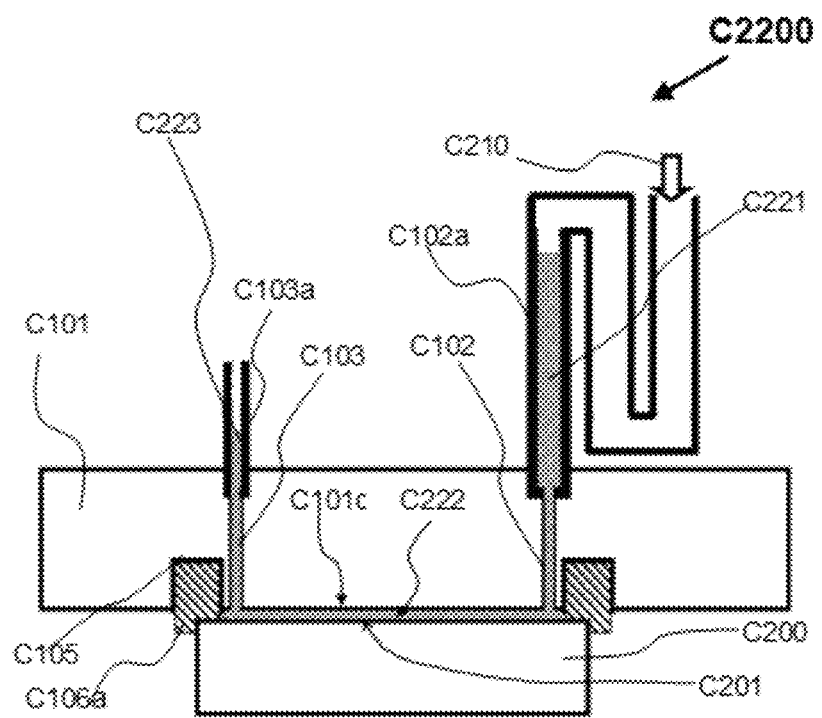
Figure 21:
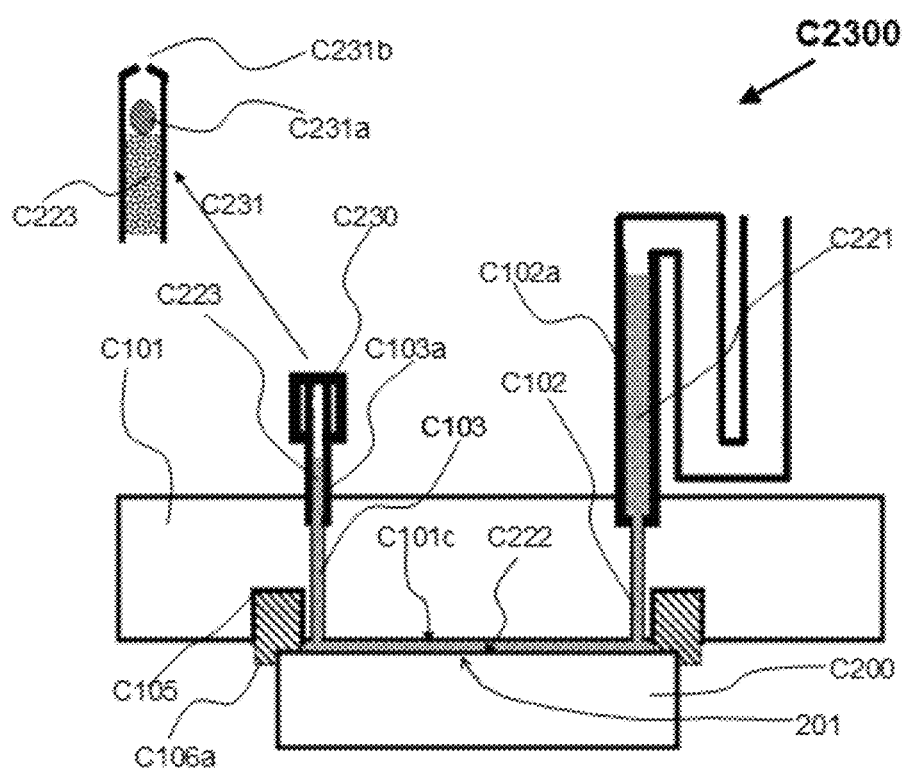

FIG. 18 to FIG. 21 are schematic diagrams for illustrating an assembly process for assembling the heat-dissipating object C110 with an electronic device C200 and providing a liquid thermal interface material (TIM), in which some more features of the heat-dissipating object with a reservoir structure are also illustrated. The assembly process mainly includes the steps from (a) to (d) as follows:

(a): C2000 in FIG. 18 illustrates to cover the heat-dissipating object C110 as showed in FIG. 17 onto the top surface C201 of an electronic device C200, wherein the seal ring C106 as showed in FIG. 17 is aligned with and compressed onto a peripheral edge region C201a of the top surface C201 of the electronic device C200 so that the seal ring C106 is deformed under a compression as illustrated by C106a, tightly sealing the gap between the bottom surface of the base plate C101 and the top surface C201 of the electronic device C200, and providing a sealed gap C202 between a portion C101c of the bottom surface of the base plate C101 surrounded by the seal ring and a portion of the top surface C201 of the electronic device C200;

(b): C2100 in FIG. 19 illustrates to open the outer end of the liquid-storage tube C102a by removing the cap C112 and to apply a force as designated by the arrow C210, for example, an air pressure for driving the liquid C111 to flow into the sealed gap C202 and the air-vent tubes C103a, as showed by the arrow dash line Cilia;

(c): C2200 in FIG. 20 illustrates that the liquid C111 has flowed into the sealed gap C202 and the air-vent tubes C103a, providing a liquid TIM C222 between a portion C101c of the bottom surface of the base plate C101 surrounded by the seal ring and a portion of the top surface C201 of the electronic device C200;

(d): C2300 in FIG. 21 illustrates to use a rubber or screw cap C230 or other ways C231 to close the outer ends of the air-vent tubes C103a when the liquid C111 has flowed into the air-vent tubes C103a as showed by C223.

It is noted that the assembly process illustrated above is based on the heat-dissipating object C110 as showed in FIG. 17, which has the liquid C111 pre-stored in the liquid-storage tube C102a. Another assembly process is based on the heat-dissipating object C100, wherein C100 is assembling with the electronic device C200 first, and then a liquid material is placed into the liquid-storage tube C102a for further providing a liquid TIM.

It is seen from FIG. 18 to FIG. 21 that some more features of the heat-dissipating object C1000 include:

a) the base plate C101 has a slot C105 in a ring form on its bottom surface, the seal ring C106 is mounted in the slot C105, directly sealing a peripheral edge region at the top surface C201 of the electronic device C200 with a portion on the bottom surface of the base plate, providing a sealed gap C202 between a portion C101c of the bottom surface of the base plate surrounded by the seal ring C106a and a portion C201 of the top surface of the electronic device surrounded by the seal ring C106a, and the sealed gap being entirely filled with a liquid material, providing a liquid TIM C222;

b) the connecting hole C102 for the liquid-storage tube C102a has two ends, its inner end is at a portion of the bottom surface of the base plate surrounded by the seal ring, and its outer end connecting to the inner end of the liquid-storage tube, and the outer end of the liquid-storage tube is opened to the ambient in the application of the electronic device, and for each air-vent tube, there is a connecting hole C102, which has two ends, its inner end is at a portion of the bottom surface of the base plate surrounded by the seal ring and its outer end connects with the inner end of the air-vent tube, and the outer end of the air-vent tube is closed by using a rubber or screw cap C230 or other ways C231 after the sealed gap being entirely filled with a liquid material. It is noted that there are other ways for closing the outer end of an air-vent tube. For example, the arrow line C231 illustrates a way for closing the outer end of an air-vent tube, wherein C231a designates a floating ball and C231b designates a small opening at the outer end of the air-vent tube so that the floating ball will close the small opening C231b when the liquid C223 fills the air-vent tube, pushing it upwards.

Figure 22:
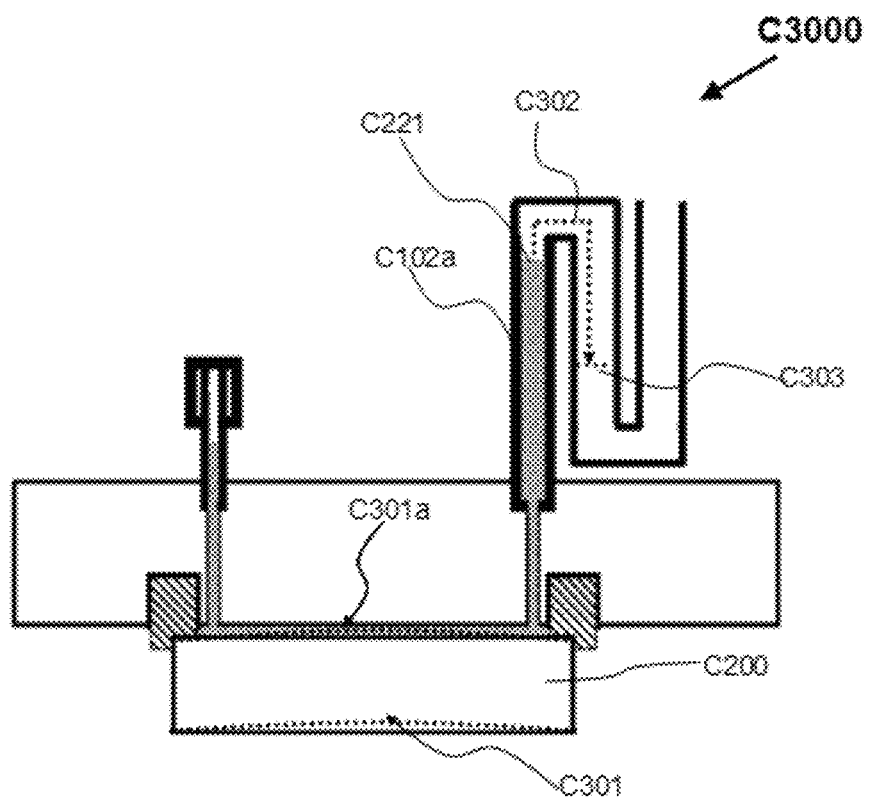
FIG. 22 and FIG. 23 are schematic diagrams for illustrating an alleged problem and a physical mechanism used for solving the alleged problem in the present invention.
Figure 23:
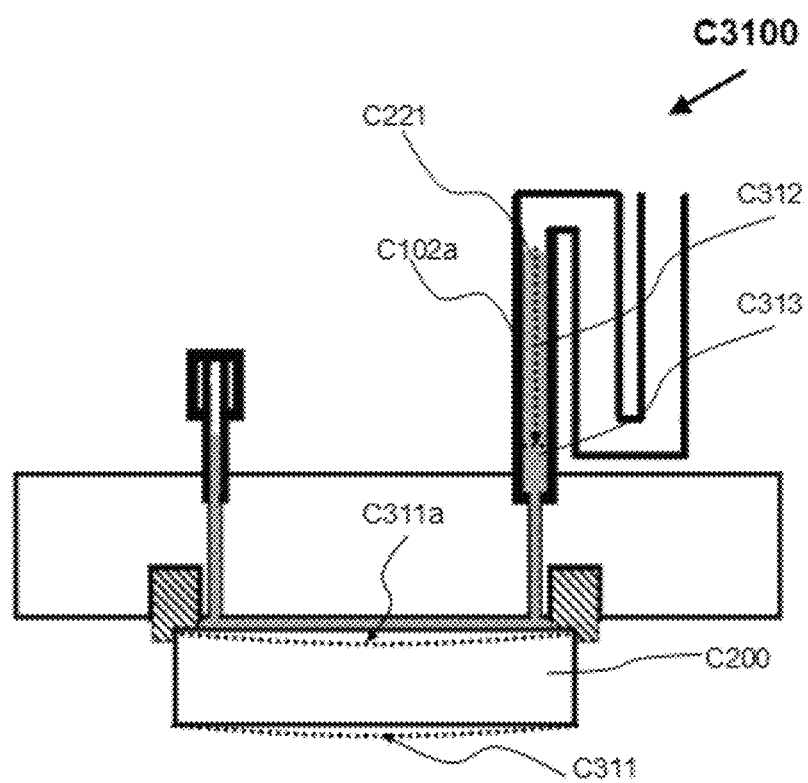

FIG. 22 and FIG. 23 are schematic diagrams for illustrating an alleged problem and a physical mechanism for solving the alleged problem in the present invention. The top surface of the electronic device C200 with an IC chip and an organic substrate is not always flat. In fact, because of the CTE (coefficient of thermal expansion) mismatch between silicon chip and organic substrate, the electronic device C200 warps upwards or downwards with temperature. It usually warps downwards at low temperature as showed in FIG. 22 and upwards at high temperature as showed in FIG. 23. This is called warpage of an electronic device, like a flip chip package. When assembling and fixing a heat-dissipating object over the electronic device C200, the volume of the gap between them will change with temperature due to the warpage. The volume change is very large. For example, in some situations, the volume of the sealed gap C202 at high temperature can be double as compared to its volume at low temperature. So, if only using a seal ring without the liquid-storage tube, when the volume of the gap becomes smaller, the liquid pressure in the sealed gap C202 will become very high, causing the damage of the seal ring in its long term application, and when the volume of the gap becomes larger, the sealed gap C202 will not be entirely filled with the liquid, causing a very high thermal resistance between the electronic device and the heat-dissipating object. The present invention solves the problem by coupling a reservoir structure with a heat-dissipating object. As illustrated by C301, C301a, C302 and C303 in FIG. 22, when the volume of the sealed gap C202 becomes smaller, the excessive liquid in the gap will flow back into the liquid-storage tube, keeping the liquid pressure not to be high. And as illustrated by C311, C311a, C312 and C313 in FIG. 23, when the volume of the sealed gap C202 becomes larger, the liquid stored in the liquid-storage tube will flow into the gap, keeping the gap to be entirely filled with the liquid all the time.

It is seen from the explanation above in conjunction with FIG. 22 and FIG. 23 that the outer ends of the one or more air-vent tubes need to be closed when the sealed gap being entirely filled with a liquid. Otherwise, a loop from the liquid-storage tube to the air-vent tube together with the ambient will take place, which will cause the leakage of the liquid due to the gravity when the orientation of the outer ends of the tubes points to the gravity. After the outer ends of the one or more air-vent tubes are closed, the liquid system has only one opening to the ambient, i.e., the outer end of the liquid-storage tube. As a result, the gravity will not cause the liquid in the liquid-storage tube to flow out even when the orientation of the outer end of the liquid-storage tube points to the gravity. It is also noted that in the situation for reworking the assembly of the heat-dissipating object and the electronic device, the outer ends of the one or more air-vent tubes may be re-opened so that the liquid in the sealed gap can be absorbed back into the liquid-storage tube first, and then the heat-dissipating object can be safely removed from the assembly.

Figure 24:
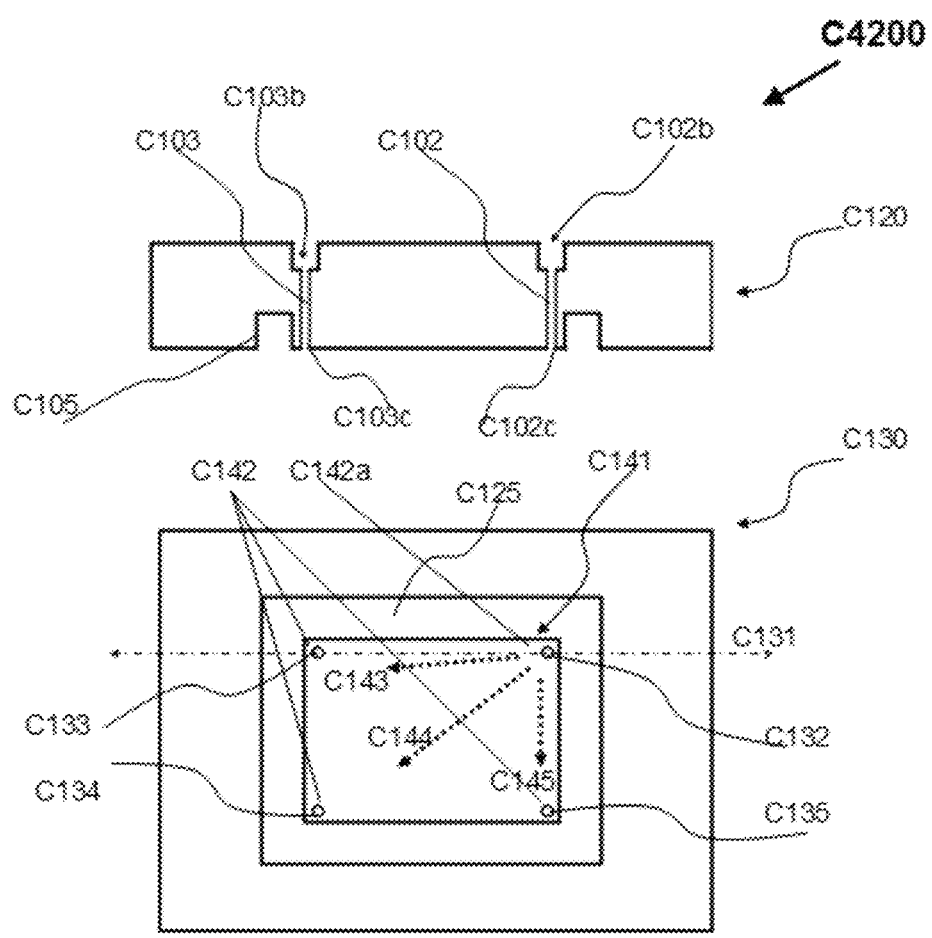
FIG. 24 and FIG. 25 are schematic diagrams for illustrating some options for designing a slot and one or more connecting holes in the base plate of the heat dissipating object of some embodiments of the present invention.
Figure 25:
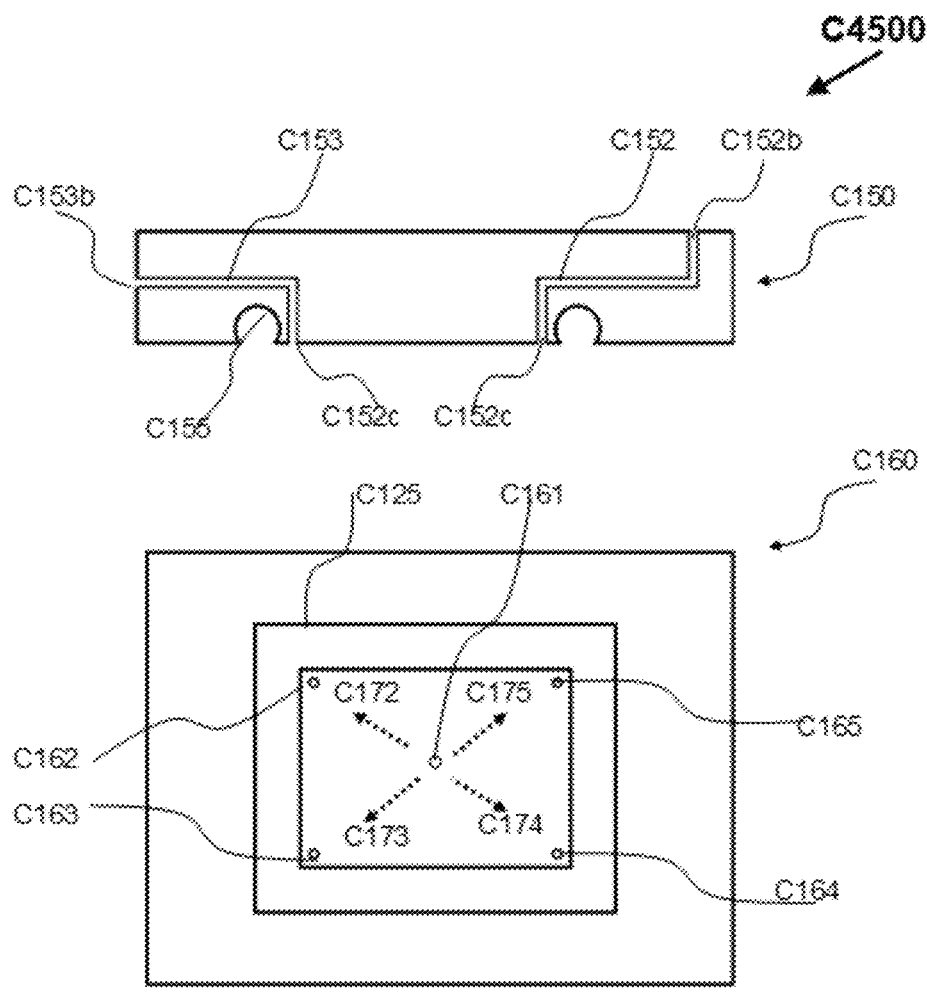

FIG. 24 and FIG. 25 are schematic diagrams for illustrating some options for designing a slot and one or more connecting holes in the base plate of the heat dissipating object of some embodiments of the present invention. C4200 in FIG. 24 is a schematic diagram for illustrating the cross-sectional and bottom views of the base plate C101 of the heat-dissipating object as showed in FIG. 17 to FIG. 23, in which C120 and C130 are the cross-sectional view and bottom view of the base plate, respectively. The arrow dash line C131 in the bottom view C130 designates the cross-sectional location for getting the cross-sectional view C120. In the cross-sectional view C120, C102c and C102b designate the inner end and outer end of the connecting hole C102, and C103c and C103b designate the inner end and outer end of the connecting hole C103. The connection between the outer end of a connecting hole and the inner end of a tube can be designed to be a screw or bonding connection, which is a regular practice in industry and not be depicted herein. In the bottom view C130, the design for the locations of the inner ends of the holes C102 and C103 are explained in some details, wherein the portion as designated by C141 of the bottom surface of the base plate surrounded by the seal ring C106 is in a rectangular shape, having four corner regions as designated by C142 and C142a, the heat-dissipating object has three air-vent tubes for this case, the inner ends C133, C134 and C135 of the three connecting holes C103 for the three air-vent tubes C103a separately locate at three corner regions C142, and the inner end C132 of the connecting hole C102 for the liquid-storage tube C102a locates at the other corner region C142a. In such a way for the design of the locations of the inner ends of the tubes, the sealed gap C202 as showed in FIG. 19 can be entirely filled by the liquid flowing out from the liquid-storage tube C102a via the connecting hole C102 and its inner end C132 to the sealed gap C202, as illustrated by the arrow dash line C143, C144 and C145 for the liquid flowing in the sealed gap C202. It is an option for the reservoir structure of one embodiment of the present invention to have only one air-vent tube and correspondingly one connecting hole for the air-vent tube, wherein the two inner ends of the two connecting holes for the liquid-storage tube and the air-vent tube are designed to locate at two corner regions diagonally opposite from one to the other, like C132 and C134.

C4500 in FIG. 25 is a schematic diagram for illustrating some other options for designing the configurations of the connecting holes C102 and C103 and the slot C105 in the base plate C101 of some embodiments of the present invention, in which C150 is for illustrating the configurations of the connecting holes C102 and C103 and the slot C105, and C160 is for illustrating to use four air-vent tubes. C155 in C150 illustrates that the cross-sectional shape of the slot is in a semi-circular form so that the seal ring can be locked inside, and C152 and C153 in C150 illustrate that the connecting holes can travel some distance in the base plate for their outer ends C152b and C153b to come out from other locations of the base plate when needed for some specific application. C160 in FIG. 25 illustrates to use four air-vent tubes for the reservoir structure, in which the portion of the bottom surface of the base plate surrounded by the seal ring is in a rectangular shape, having four corner regions, the four inner ends C162, C163, C164 and C165 of the four connecting holes corresponding to the four air-vent tubes separately locate at the four corner regions, and the inner end C161 of the connecting hole for the liquid-storage tube locates at the center region of the portion of the bottom surface of the base plate surrounded by the seal ring, in which the arrow dash lines C172, C173, C174 and C175 illustrate the liquid flowing in the sealed gap when it flows out from C161. The reservoir structure with four air-vent tubes can ensure that the sealed gap C202 as showed in FIG. 19 is entirely filled with the liquid.

FIG. 26 to FIG. 32 are schematic diagrams for illustrating some embodiments of the present invention, in which the heat-dissipating object C110 is a heat sink, a cold plate or a vapor chamber.

Figure 26:
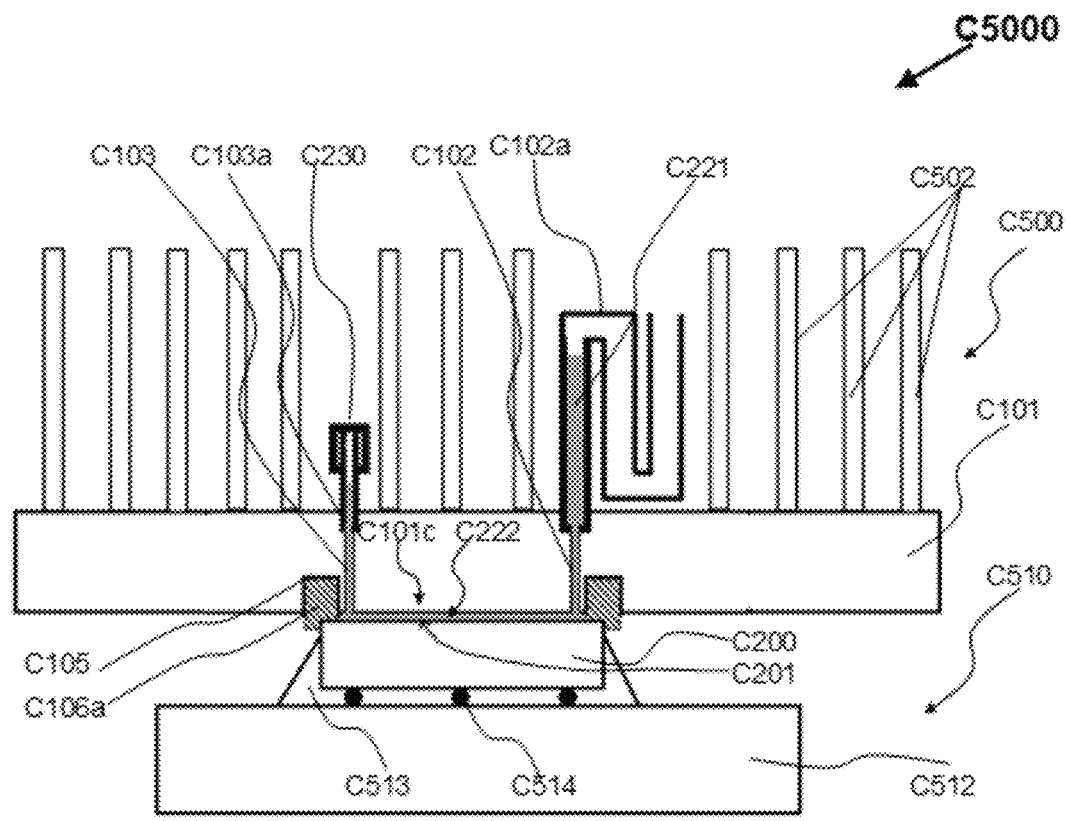
FIG. 26 to FIG. 28 are schematic diagrams for illustrating the heat-dissipating object is a heat sink of one preferred embodiment of the present invention.
Figure 27:
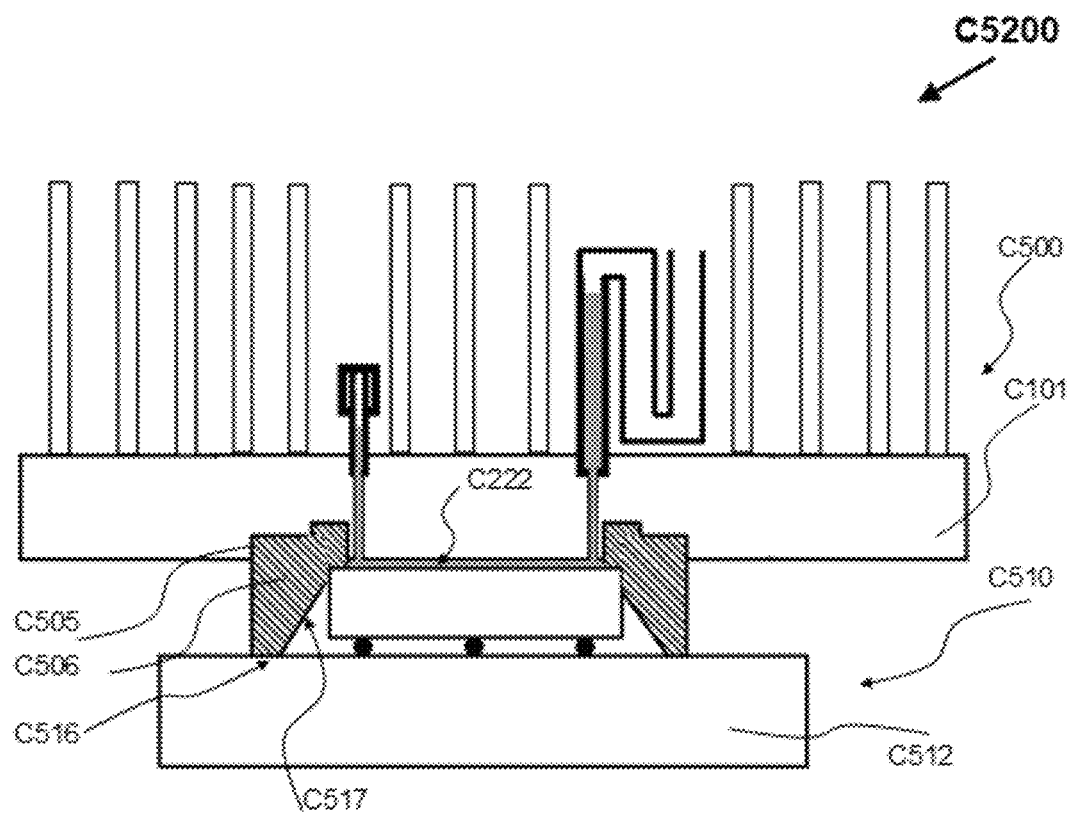
Figure 28:
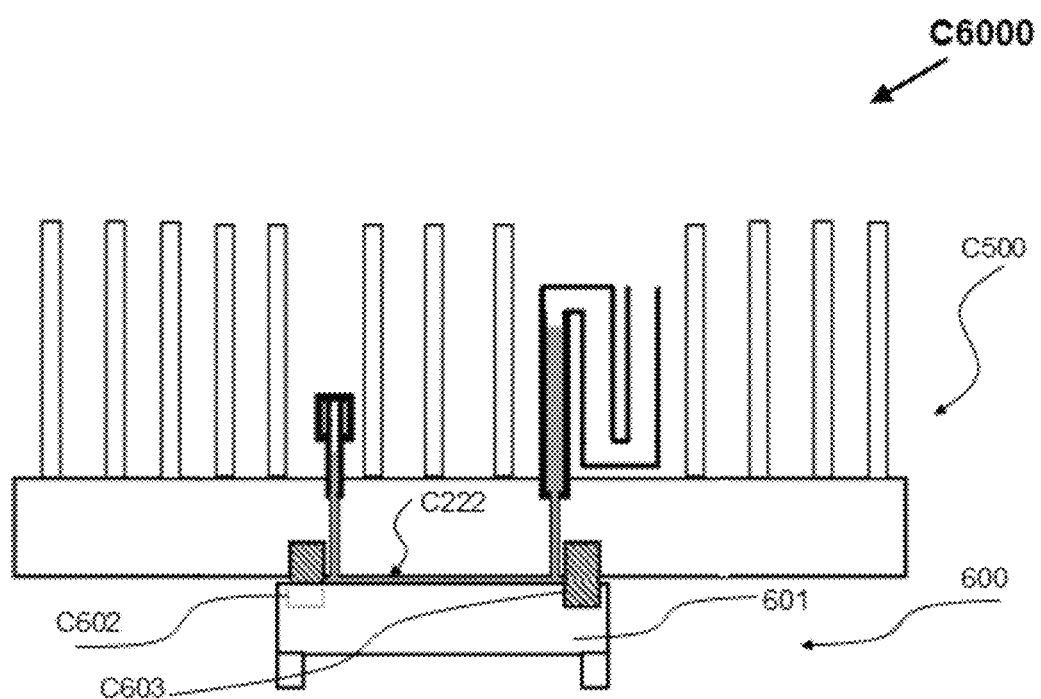

FIG. 26 is a schematic diagram for illustrating an example of the heat-dissipating object with a reservoir structure allowing for a liquid thermal interface material (TIM) to transfer heat from an electronic device of one embodiment of the present invention, wherein the heat-dissipating object and the electronic device are a heat sink and a flip chip package. C5000 in FIG. 26 designates a flip chip package C501 assembled with a heat sink C500, wherein the flip chip package C501 includes a flip chip C200 attached on a substrate C512 through the bumps C514 and the under-fill material C513. Taking C2300 in FIG. 21 as reference, the heat sink C500 is formed by adding the fins C502 on the base plate C101, and the flip chip package C501 is formed by viewing C200 as a flip chip and attaching it on the substrate C512. FIG. 27 is a schematic diagram for illustrating another design for a slot and a seal ring of a reservoir structure. Taking the slot C105 and the seal ring C106 in FIG. 21 as reference, C5200 in FIG. 27 illustrates another structure of slot C505 and seal ring C506, wherein the seal ring C506 also seals the sides C516 of the flip chip and a portion C516 of the substrate surrounding the flip chip from its sides, and is compressed between the bottom surface of the base plate C101 and the flip chip C200 and substrate C512. FIG. 28 is a schematic diagram for illustrating an assembly C6000 of the heat sink with the reservoir C500 and an electronic device C600, wherein the electronic device C600 is a lidded flip chip package, consisting of a flip chip package covered with a lid C601, the top surface of the lid being the top surface of the electronic device, and the seal ring directly sealing a peripheral region at the top surface of the lid. For simplicity, the lid C601 is only displayed for the electronic device C600 in the assembly C6000, wherein C602 illustrates that the lid has a slot in a ring form in a peripheral region at the top surface of the lid, C603 illustrates that the seal ring is interposed and compressed between the slot C602 at the top surface of the lid and the slot C105 at the bottom surface of the base plate of the heat sink.

Figure 29:
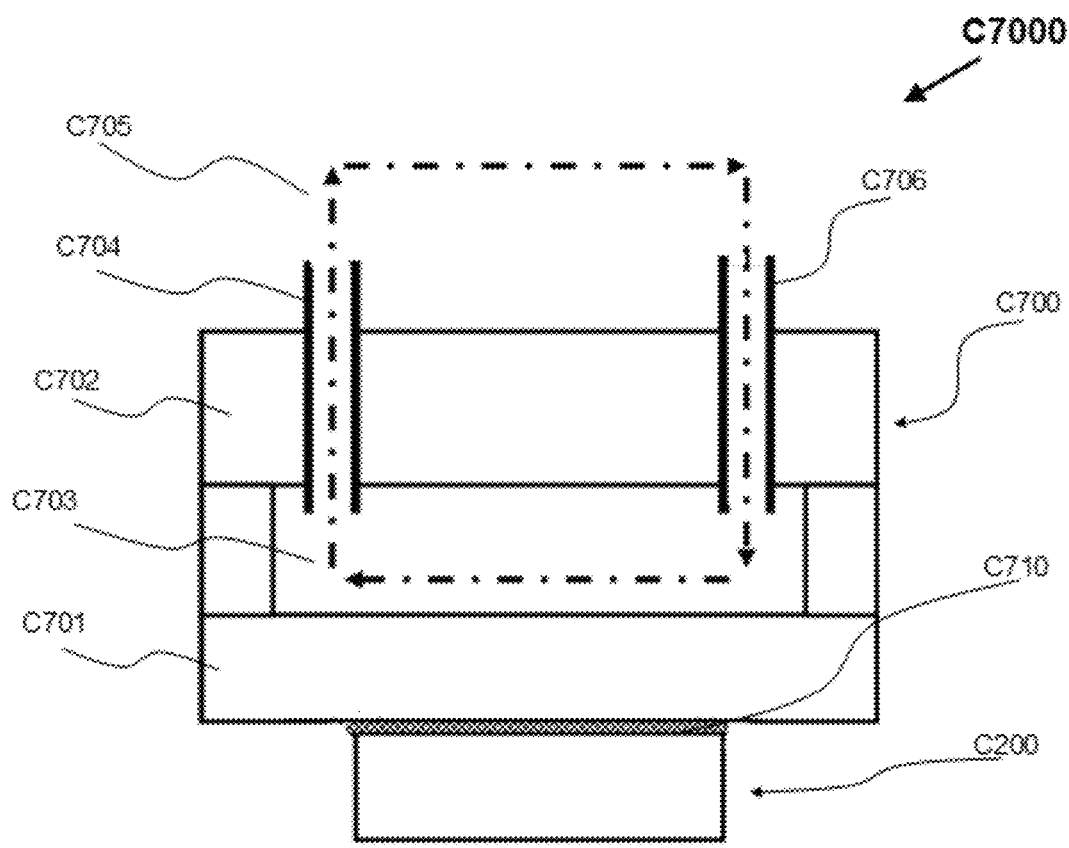
FIG. 29 to FIG. 30 are schematic diagrams for illustrating the heat-dissipating object is a cold plate of one preferred embodiment of the present invention.
Figure 30:
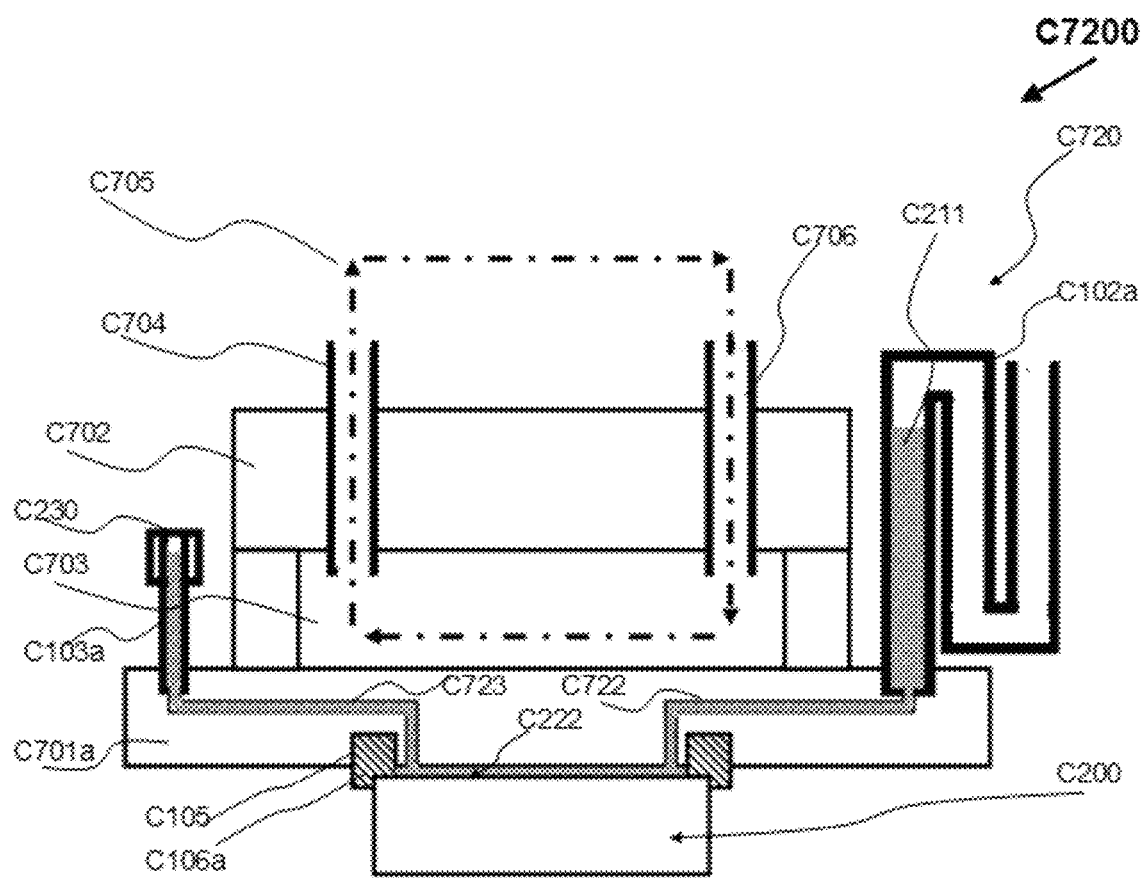

FIG. 29 and FIG. 30 are schematic diagrams for illustrating another example of a heat-dissipating object with a reservoir structure allowing for a liquid thermal interface material (TIM) to transfer heat from an electronic device of another embodiment of the present invention, wherein the heat-dissipating object and the electronic device are a cold plate and a flip chip package. C7000 in FIG. 29 illustrates a traditional cold plate C700 attached on an electronic device C200, and a traditional TIM C710 being interposed between C700 and C200. The traditional cold plate C700 mainly includes a base plate C701, a cap C702 and a circulating system C703, C704, C705 and C706. C703 is a closed chamber formed by assembling the cap C702 with the base plate C701, C706 and C704 are an inlet tube and an outlet tube for a coolant to go in and out the chamber C703, and the arrow dash line C705 illustrates a circulating system which drives a coolant to circulate in and out the chamber C703, taking the heat away from the electronic device C200. For simplicity, the details of the circulating system C705 are not displayed. C7200 in FIG. 30 illustrates a cold plate C720, having a reservoir structure of one embodiment of the present invention, wherein the base plate C701a is designed to extend out for getting some room to assemble the liquid-storage tube 102a and the air-vent tube 103a, and the connecting holes C722 and C723 travel some distance in the base plate so that their outer ends are outside the closed chamber C703, and a liquid TIM C222 between the base plate and the electronic device C200 is provided. It is noted that the same numerical numbers in different figures designate the same elements.

Figure 31:
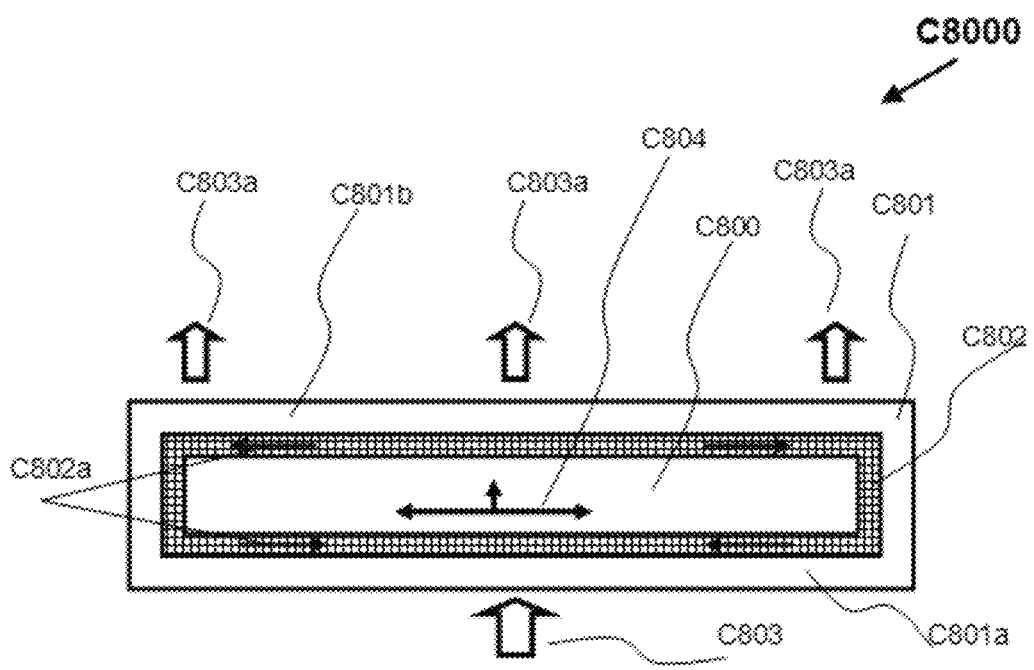
FIG. 31 to FIG. 33 are schematic diagrams for illustrating the heat-dissipating object is a vapor chamber of one preferred embodiment of the present invention.
Figure 32:
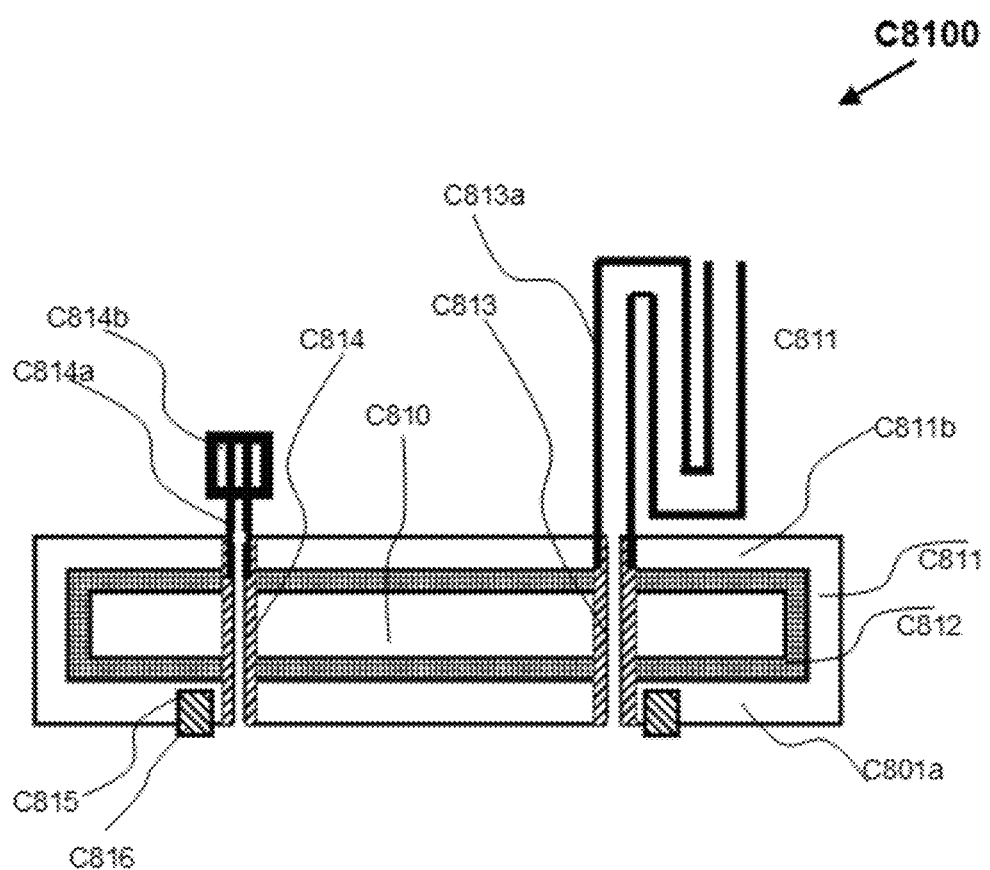
Figure 33:
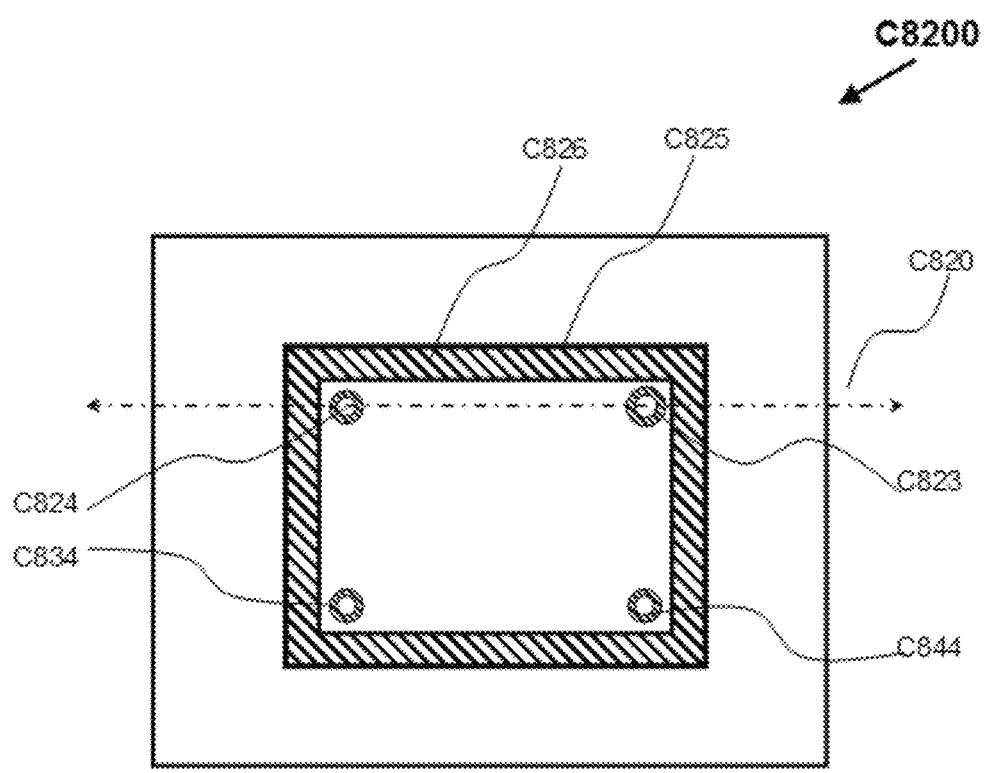

FIG. 31 to FIG. 33 are schematic diagrams for illustrating another example of a heat-dissipating object with a reservoir structure allowing for a liquid thermal interface material (TIM) to transfer heat from an electronic device of another embodiment of the present invention, wherein the heat-dissipating object is a vapor chamber.

C8000 in FIG. 31 designates a traditional vapor chamber, including a shell C801 which forms a chamber C800, a wick layer C802 which is attached on the inner surface of the shell C801, and a two phase material, i.e., the liquid phase C802a and a vapor phase C804, which is enclosed in the chamber C800. It is noted that the arrows also designated by C802a and C804 illustrate the flow of the two phase material in the chamber. The arrow C803 illustrates a heat input from an electronic device, which vaporizes the liquid C802a in the wick layer C802 into a vapor phase C804, and the arrow C803a illustrates a heat output from the vapor chamber C8000, which will be further dissipated to the ambient by using some way. The portion C801a of the shell on the heat input side is called a base plate of the vapor chamber herein, and the portion C801b of the shell on the heat output side is called a top piece of the vapor chamber herein.

C8100 in FIG. 32 designates a vapor chamber coupled with a reservoir structure of one embodiment of the present invention, in which C815 designates a slot in a ring form at the bottom surface of the base plate C801a of the vapor chamber, C816 designates a seal ring mounted in the slot C815, C813 and C814 designate connecting holes through the vapor chamber from its base plate C801a to its top piece C801b, C813a and C814a designate a liquid-storage tube and one or more air-vent tubes, which connect with the connecting holes C813 and C814, and the C814b designates a cap for closing the outer ends of the one or more air-vent tubes C814a. C8200 in FIG. 33 designates the bottom view of the vapor chamber, in which the arrow dash line C820 designates the cross-sectional location for getting the cross-sectional view C8100 of the vapor chamber in FIG. 32, C823 designates the bottom view of the connecting hole C813 in FIG. 32, and C824, C834 and C844 designate the bottom view of the connecting holes C814 in the case of three air-vent tubes. The assembly of the vapor chamber C8000 and an electronic device is similar as those depicted previously in conjunction with FIG. 26 to FIG. 30, which is not repeated herein.

It is noted that the spirit and scope of the present invention is to couple a reservoir structure with a heat dissipating object. As the examples of the heat-dissipating object, the lid, the heat sink, the cold plate and the vapor chamber have been described in conjunction with the drawings in FIG. 3 to FIG. 33. The top piece of the lid can be viewed as the base plate when generally viewing the lid as a heat-dissipating object. In an electronic device with a semiconductor chip as a heat-generating object, the heat-dissipating-object usually includes a lid, a heat sink, a cold plate and a vapor chamber, or a combination of these heat-dissipating-objects. These heat-dissipating objects commonly include a base plate having a top and bottom surface, and the bottom surface of the heat-dissipating objects contacts the top surface of the electronic device through a TIM for transferring the heat from the electronic device to the ambient or other heat-dissipating objects. So, based on the spirit and scope of the present invention, a reservoir system can be formed in an electronic device, allowing for a liquid TIM in the gap between the heat-dissipating object and the electronic device. A reservoir structure of the lid and the heat-dissipating object of some embodiments of the present invention is described in conjunction with FIG. 3 to FIG. 13, wherein one or more tunnels formed in the base plate of the lid and the heat-dissipating object are used for storing a liquid material and providing a liquid TIM, and another reservoir structure of the heat-dissipating object of some embodiments of the present invention are described in conjunction with FIG. 17 to FIG. 33, wherein one liquid-storage tube and one or more air-vent tubes are designed for storing a liquid material and providing a liquid TIM.

Although the present invention is described in some details for illustrative purpose with reference to the specific embodiments and drawings, it is apparent that many other modifications and variations may be made without departing from the spirit and scope of the present invention.

What is claimed is:

1. A heat-dissipating object allowing for a liquid thermal interface material (TIM) to transfer heat from an electronic device, comprising:
a base plate having a top surface and a bottom surface, and
a reservoir structure, including a seal ring, a liquid-storage tube, one or more air-vent tubes, a connecting hole for each air-vent tube, and a connecting hole for the liquid-storage tube,
wherein the base plate has a slot in a ring form on its bottom surface, the seal ring is mounted in the slot, directly sealing a peripheral region at a top surface of the electronic device with a portion on the bottom surface of the base plate, providing a sealed gap between a portion of the bottom surface of the base plate and a portion of a top surface of the electronic device, and the sealed gap being entirely filled with a liquid material,
wherein the air-vent tubes and the liquid-storage tube each have two ends, respectively called an inner end and an outer end, each connecting hole has two ends, respectively called an inner end and the outer end,
the inner end of each connecting hole, belonging to either one of the air-vent tube or the liquid-storage tube, is at a portion of the bottom surface of the base plate surrounded by the seal ring, and the outer end of each connecting hole is outside the bottom surface of the base plate surrounded by the seal ring, connecting with the inner end of either one of the air-vent tubes or the liquid-storage tube, and
wherein the outer ends of the one or more air-vent tubes are closed to an ambient and the outer end of the liquid-storage tube is open to the ambient.

2. The heat-dissipating object of claim 1, wherein the heat-dissipating object is a heat sink, a cold plate or a vapor chamber.

3. The heat-dissipating object of claim 1, wherein the liquid material is a liquid metal, including gallium and gallium alloy.

4. The heat-dissipating object of claim 1, wherein the electronic device is a flip chip package, including a flip chip attached on a substrate, the flip chip has a top surface, a bottom surface and four sides, the top surface of the flip chip is the top surface of the electronic device, and the seal ring directly seals a peripheral edge region at the top surface of the flip chip.

5. The heat-dissipating object of claim 4, wherein the seal ring also seals the sides of the flip chip and a portion of a top surface of the substrate surrounding the sides of the flip chip.

6. The heat-dissipating object of claim 1, wherein the seal ring is compressed between the bottom surface of the base plate and a top surface of the electronic device.

7. The heat-dissipating object of claim 1, wherein the electronic device is a lidded flip chip package, including a flip chip package covered with a lid, and the seal ring directly seals a peripheral region at a top surface of the lid.

8. The heat-dissipating object of claim 1, wherein the electronic device is a lidded flip chip package, including a flip chip package covered with a lid, the seal ring directly seals a peripheral region at a top surface of a lid, and wherein the lid has a slot in a ring form at a peripheral region of a top surface of the lid, the seal ring is interposed between the slot at a top surface of the lid and the slot at the bottom surface of the base plate.

* * * * *